(12) United States Patent
Morishima et al.

(10) Patent No.: US 10,333,100 B2
(45) Date of Patent: Jun. 25, 2019

(54) ORGANIC ELECTROLUMINESCENT DEVICE

(71) Applicant: SUMITOMO CHEMICAL COMPANY, LIMITED, Tokyo (JP)

(72) Inventors: Shinichi Morishima, Niihama (JP); Masato Shakutsui, Niihama (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

(21) Appl. No.: 15/506,593

(22) PCT Filed: Aug. 26, 2015

(86) PCT No.: PCT/JP2015/074077
§ 371 (c)(1),
(2) Date: Feb. 24, 2017

(87) PCT Pub. No.: WO2016/031877
PCT Pub. Date: Mar. 3, 2016

(65) Prior Publication Data
US 2017/0256737 A1 Sep. 7, 2017

(30) Foreign Application Priority Data

Aug. 29, 2014 (JP) ................................ 2014-175615

(51) Int. Cl.
*H01L 51/52* (2006.01)
*H01L 51/56* (2006.01)
(Continued)

(52) U.S. Cl.
CPC ...... *H01L 51/5243* (2013.01); *H01L 51/0097* (2013.01); *H01L 51/5246* (2013.01);
(Continued)

(58) Field of Classification Search
CPC ............. H01L 51/5243; H01L 51/5253; H01L 51/56; H01L 2251/5338
See application file for complete search history.

(56) References Cited

U.S. PATENT DOCUMENTS

2010/0258839 A1* 10/2010 Matsue ................ H01L 51/529
257/100
2011/0315977 A1 12/2011 Murayama et al.
(Continued)

FOREIGN PATENT DOCUMENTS

JP 2004-171806 A 6/2004
JP 2006-185643 A 7/2006
(Continued)

OTHER PUBLICATIONS

Machine English Translation of JP 2004-171806, Nakamura, published Jun. 17, 2004.*
(Continued)

*Primary Examiner* — Peniel M Gumedzoe
(74) *Attorney, Agent, or Firm* — Sughrue Mion, PLLC

(57) ABSTRACT

An organic electroluminescent device comprising:
  a transparent support substrate having flexibility;
  a light emitting element disposed on the transparent support substrate and including a pair of electrodes and a luminescent layer disposed between the pair of electrodes;
  a sealing material layer disposed on the transparent support substrate so as to cover and seal the light emitting element; and
  a sealing substrate disposed on the sealing material layer, wherein
  based on an arithmetic average of roughness profile defined in JIS B 0601-1994, the surface roughness of a surface of the sealing substrate beside the sealing
(Continued)

material layer has a smaller value than the surface roughness of the other surface of the sealing substrate, and the arithmetic average of roughness profile of the surface of the sealing substrate beside the sealing material layer and a thickness of the sealing material layer satisfy a requirement represented by the following formula (I):

$$0.002 < (Ra/t) < 0.2 \qquad (I)$$

[in the formula (I), Ra denotes the arithmetic average of roughness profile of JIS B 0601-1994 of the surface of the sealing substrate beside the sealing material layer, and t denotes the thickness of the sealing material layer].

7 Claims, 2 Drawing Sheets

(51) Int. Cl.
  *H05B 33/02* (2006.01)
  *H05B 33/04* (2006.01)
  *H01L 51/00* (2006.01)
(52) U.S. Cl.
  CPC .......... *H01L 51/5253* (2013.01); *H01L 51/56* (2013.01); *H05B 33/02* (2013.01); *H05B 33/04* (2013.01); *H01L 2251/5338* (2013.01); *H01L 2251/558* (2013.01); *Y02E 10/549* (2013.01)

(56) References Cited

U.S. PATENT DOCUMENTS

| | | |
|---|---|---|
| 2012/0007134 A1 | 1/2012 | Miyai et al. |
| 2013/0069042 A1 | 3/2013 | Matsuura et al. |
| 2014/0097424 A1 | 4/2014 | Miyai et al. |
| 2014/0284589 A1 | 9/2014 | Matsuura et al. |

FOREIGN PATENT DOCUMENTS

| | | |
|---|---|---|
| JP | 2008-010211 A | 1/2008 |
| JP | 2010-198980 A | 9/2010 |
| JP | 2010-231977 A | 10/2010 |
| JP | 2011-222334 A | 11/2011 |
| JP | 2012-212675 A | 11/2012 |
| JP | 2013095991 A | 5/2013 |
| WO | 2011/114860 A1 | 9/2011 |
| WO | 2016031876 A1 | 3/2016 |

OTHER PUBLICATIONS

Machine English Translation of JP 2010-231977, Takarazumi et al., published Oct. 14, 2010.*
Surface Roughness (JISB B 0601-2001) [online], [retrieved on Sep. 19, 2018], retrieved from "http://www.engineering.com".*
International Search Report of PCT/JP2015/074077 dated Nov. 10, 2015.
International Preliminary Report on Patentability and Translation of Written Opinion, dated Mar. 9, 2017, from the International Bureau in counterpart International application No. PCT/JP2015/074077.
Communication dated Mar. 27, 2018 from the European Patent Office in counterpart Application No. 15835305.2.
Junji Miyake, "Overview of Copper Foil," Japan Institute of Electronic Imaging; vol. 6, No. 6 (2003), pp. 528-533.

* cited by examiner

ORGANIC ELECTROLUMINESCENT DEVICE

CROSS REFERENCE TO RELATED APPLICATIONS

This application is a National Stage of International Application No. PCT/JP2015/074077 filed Aug. 26, 2015, claiming priority based on Japanese Patent Application No. 2014-175615 filed Aug. 29, 2014, the contents of all of which are incorporated herein by reference in their entirety.

TECHNICAL FIELD

The present invention relates to an organic electroluminescent device.

BACKGROUND ART

An organic electroluminescent device deteriorates due to the permeation of an oxygen gas, water vapor, or the like to the inside of the device, and lowers the light-emission performance due to the generation of an emission-defective spot called a dark spot. Hence, for the purpose of inhibiting an oxygen gas or water vapor from permeating the inside of a device, use of a sealing material has been proposed in the field of the organic electroluminescent device. For example, International Publication No. WO2011/114860 (Patent Literature 1) discloses an organic electroluminescent device in which at least a transparent anode layer, an organic layer including a luminescent layer, and a cathode layer are layered in this order on a transparent base material, the organic electroluminescent device including a first sealing film disposed on the transparent anode layer side, a second sealing film disposed on the cathode layer side, and a sealing layer made of a thermosetting resin and provided on the surface of the cathode layer opposite to the organic layer. However, the conventional organic electroluminescent device as described in Patent Literature 1 is not necessarily satisfactory from the viewpoint of preventing the occurrence of a short circuit after being bent.

CITATION LIST

Patent Literature

[PLT 1] International Publication No. WO2011/114860

SUMMARY OF INVENTION

Technical Problem

The present invention has been made in view of the foregoing problems of the conventional technique, and has an object to provide an organic electroluminescent device capable of satisfactorily inhibiting the occurrence of a short circuit after being bent.

Solution to Problem

In order to achieve the above object, the present inventors have earnestly studied and consequently found that an organic electroluminescent device (OLED: simply referred to as an "organic EL device" in some cases below) is made capable of satisfactorily inhibiting the occurrence of a short circuit after being bent, when the organic EL device comprises: a transparent support substrate having flexibility; a light emitting element disposed on the transparent support substrate and including a pair of electrodes and a luminescent layer disposed between the pair of electrodes; a sealing material layer disposed on the transparent support substrate so as to cover and seal the light emitting element; and a sealing substrate disposed on the sealing material layer, wherein based on an arithmetic average of roughness profile defined in JIS B 0601-1994, the surface roughness of a surface of the sealing substrate beside the sealing material layer has a smaller value than the surface roughness of the other surface of the sealing substrate, and the arithmetic average of roughness profile of the surface of the sealing substrate beside the sealing material layer and a thickness of the sealing material layer satisfy a requirement represented by the following formula (I):

$$0.002 < (Ra/t) < 0.2 \qquad (I)$$

[in the formula (I), Ra denotes the arithmetic average of roughness profile of JIS B 0601-1994 of the surface of the sealing substrate beside the sealing material layer, and t denotes the thickness of the sealing material layer]. Thus, the present inventors have completed the present invention.

Specifically, an organic electroluminescent device according to the present invention comprises:

a transparent support substrate having flexibility;

a light emitting element disposed on the transparent support substrate and including a pair of electrodes and a luminescent layer disposed between the pair of electrodes;

a sealing material layer disposed on the transparent support substrate so as to cover and seal the light emitting element; and a sealing substrate disposed on the sealing material layer, wherein based on an arithmetic average of roughness profile defined in JIS B 0601-1994, the surface roughness of a surface of the sealing substrate beside the sealing material layer has a smaller value than the surface roughness of the other surface of the sealing substrate, and the arithmetic average of roughness profile of the surface of the sealing substrate beside the sealing material layer and a thickness of the sealing material layer satisfy a requirement represented by the following formula (I):

$$0.002 < (Ra/t) < 0.2 \qquad (I)$$

[in the formula (I), Ra denotes the arithmetic average of roughness profile of JIS B 0601-1994 of the surface of the sealing substrate beside the sealing material layer, and t denotes the thickness of the sealing material layer].

In the above organic electroluminescent device of the present invention, the arithmetic average of roughness profile of the surface of the sealing substrate beside the sealing material layer (Ra) is preferably 0.1 to 1.0 μm.

In addition, in the above organic electroluminescent device of the present invention, the thickness of the sealing material layer is preferably 5 to 120 μm.

Further, in the above organic electroluminescent device of the present invention, the sealing substrate is preferably made of any of metal materials of copper, copper alloys, aluminum, and aluminum alloys, and is more preferably made of a copper foil produced by an electrolytic process.

Advantageous Effects of Invention

According to the present invention, it is possible to provide an organic electroluminescent device capable of satisfactorily inhibiting the occurrence of a short circuit after being bent.

DESCRIPTION OF EMBODIMENTS

Hereinafter, preferred embodiments of the present invention will be described in details with reference to the drawings. In the following description and the drawings, the same or equivalent elements will be assigned with the same sign, and redundant explanation thereof will be omitted.

An organic electroluminescent device of the present invention comprises:

a transparent support substrate having flexibility;

a light emitting element disposed on the transparent support substrate and including a pair of electrodes and a luminescent layer disposed between the pair of electrodes;

a sealing material layer disposed on the transparent support substrate so as to cover and seal the light emitting element; and a sealing substrate disposed on the sealing material layer, wherein based on an arithmetic average of roughness profile defined in JIS B 0601-1994, the surface roughness of a surface of the sealing substrate beside the sealing material layer has a smaller value than the surface roughness of the other surface of the sealing substrate, and the arithmetic average of roughness profile of the surface of the sealing substrate beside the sealing material layer and a thickness of the sealing material layer satisfy a requirement represented by the following formula (I):

$$0.002 < (Ra/t) < 0.2 \quad (I)$$

[in the formula (I), Ra denotes the arithmetic average of roughness profile of JIS B 0601-1994 of the surface of the sealing substrate beside the sealing material layer, and t denotes the thickness of the sealing material layer].

Figure 1:
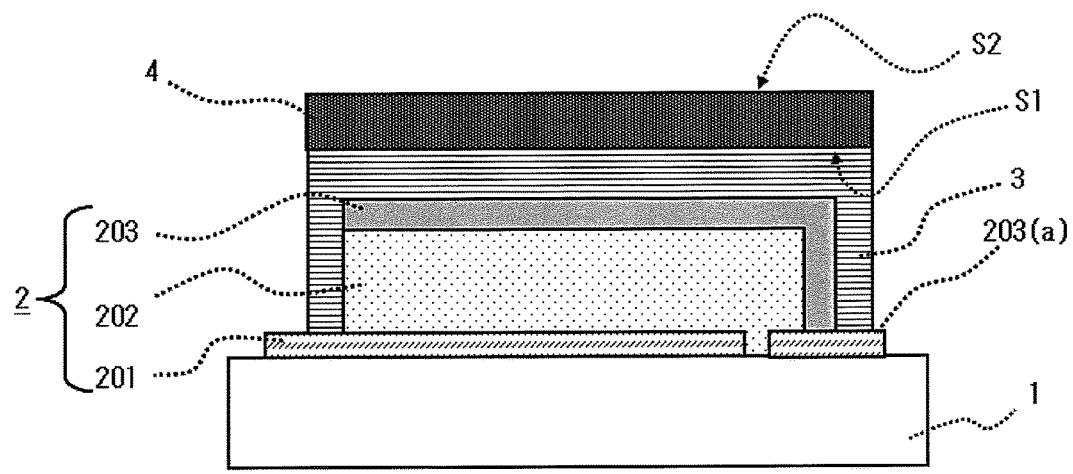
FIG. 1 is a schematic vertical cross-sectional view schematically illustrating a preferred embodiment of an organic electroluminescent device in the present invention.

FIG. 1 is a schematic vertical cross-sectional view schematically illustrating a preferred embodiment of an organic electroluminescent device in the present invention. The organic electroluminescent device in the embodiment illustrated in FIG. 1 includes a transparent support substrate 1, a light emitting element 2, a sealing material layer 3, and a sealing substrate 4. These components will be described one by one below.

[Transparent Support Substrate 1]

The transparent support substrate 1 illustrated in FIG. 1 has flexibility (bendability). As for the "flexibility" mentioned herein, the transparent support substrate 1 may just have bendability required for a substrate for a general flexible organic EL device, and a material thereof is not particularly limited. However, it is preferable that the transparent support substrate 1 be a thin film glass from the viewpoint of gas barrier properties or be a plastic base material from the viewpoints of weight reduction and fracture resistance. In addition, the transparent support substrate 1 is not particularly limited but may be any substrate having light transmittance (transparency) to the extent that the substrate can be utilized as a substrate on the light extraction side of an organic EL device. Thus, any publicly-known transparent substrate usable as a substrate on the light extraction side of an organic EL device can be used as needed, and a substrate having transparency with a total light transmittance of 80% or more can be preferably used.

Even when a plastic is used as a base material, the transparent support substrate 1 preferably has gas barrier properties. As the transparent support substrate 1, a publicly-known gas barrier film usable as a flexible transparent substrate of an organic EL device can be used as needed. For example, a gas-barrier multilayer film described in Japanese Unexamined Patent Application Publication No. 2011-73430 (JP 2011-73430 A) can be preferably used (in particular, a multilayer body in which two or more of such films are bonded together with an adhesive is more preferable).

Moreover, as the transparent support substrate 1, the following gas-barrier multilayer film is preferable the film can achieve higher water vapor permeation prevention performance; the gas-barrier multilayer film includes first and second thin film layers having gas barrier properties, first and second base material layers, and an adhesive layer, and has a multilayer structure in which the first thin film layer, the first base material layer, the adhesive layer, the second thin film layer, and the second base material layer are layered in this order. This is because. Here, if such a gas-barrier multilayer film is used, it is preferable that one of the electrodes of the light emitting element be stacked on the first thin film layer of the gas-barrier multilayer film from the viewpoint of more highly preventing deterioration of the organic EL device due to water vapor and the like. Hereinafter, the gas-barrier multilayer film suitably usable as such a transparent support substrate 1 according to the present invention will be described with reference to FIG. 2.

Figure 2:
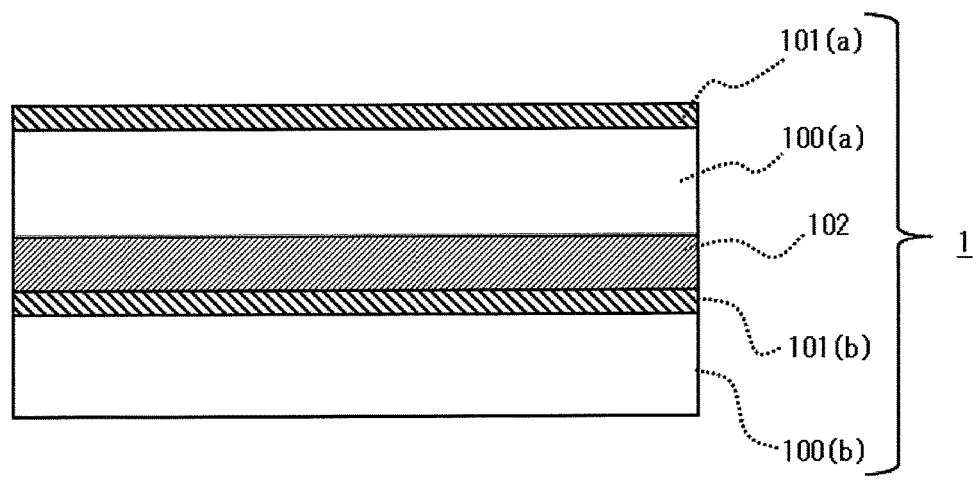
FIG. 2 is a schematic vertical cross-sectional view schematically illustrating one embodiment of a gas-barrier multilayer film suitably usable as a transparent support substrate included in the organic electroluminescent device of the present invention.

A gas-barrier multilayer film in an embodiment illustrated in FIG. 2 is a gas-barrier multilayer film including a first base material layer 100(a), a second base material layer 100(b), and a first thin film layer 101(a) having gas barrier properties, a second thin film layer 101(b) having gas barrier properties, and an adhesive layer 102, and having a multilayer structure in which the first thin film layer 101(a), the first base material layer 100(a), the adhesive layer 102, the second thin film layer 101(b), and the second base material layer 100(b) are layered in this order.

As described above, the gas-barrier multilayer film includes two base material layers called the first base material layer 100(a) and the second base material layer 100(b). Here, in the case where the number of such base material layers is only one (in the case of a structure in which the gas-barrier multilayer film does not include any one of the first base material layer and the second base material layer), it tends to be so difficult to inhibit deterioration of the organic EL device at a sufficiently high level that the deterioration proceeds at faster speed and the storage life becomes shorter than in the case where the number of base material layers is two or more. For example, assume that the second base material layer 100(b) is not present in the embodiment illustrated in FIG. 2. In this case, even if a thin film layer having gas barrier properties is formed on the first base material layer and then a step of drying the first base material is further carried out, the surface of the first base material opposite to the thin film layer having gas barrier properties is exposed to the outside, and a time until a moisture content in the first base material reaches a saturated content tends to increase significantly due to permeation of moisture into the first base material from the surface exposed to the outside. Therefore, even if the drying step is carried out during the production, the effect of drying tends to fail to be fully utilized. On the other hand, consider a case where the first base material layer 100(*a*) is not present. If second and third thin film layers are formed on both sides of the second base material and a step of drying the second base material layer is also carried out after the thin film layers are formed, it is difficult to remove moisture inside the second base material because both sides of the base material are covered by the thin film layers that exhibit barrier properties. As a result, the effect of drying tends to fail to be fully utilized.

Base materials for forming the base material layer 100(*a*) and the base material layer 100(*b*) may be the same as or different from each other. Any publicly-known base material usable to form a gas-barrier multilayer film can be used as needed. As for such base materials, it is preferable that at least one of the first base material layer 100(*a*) and the second base material layer 100(*b*) be made of an organic polymer material from the viewpoints of flexibility, light transmittance, and flatness of base materials, and weight reduction of a device. Moreover, it is more preferable that both the first base material layer 100(*a*) and the second base material layer 100(*b*) be made of an organic polymer material(s) because it is possible to obtain higher flexibility (bendability) and improve workability in processing such as parting and bending processing of the base material.

As such organic polymer materials, polyester-based resins such as polyethylene terephthalate (PET) and polyethylene naphthalate (PEN); polyolefin-based resins such as polyethylene (PE), polypropylene (PP), and cyclic polyolefin; polyamide-based resins; polycarbonate-based resins; polystyrene-based resins; polyvinyl alcohol-based resins; saponified copolymers of ethylene-vinyl acetate copolymers; polyacrylonitrile-based resins; acetal-based resins; polyimide-based resins; and the like are preferably usable because they can be used as a colorless and transparent base material.

In addition, as such an organic polymer material, preferred is a polymer material comprising a polymer containing heteroatoms (oxygen, nitrogen, etc.) other than carbon and hydrogen. A polymer material (polyolefin or the like) comprising a hydrocarbon polymer composed only of carbon and hydrogen is of a nonpolar polymer in which almost no polarization occurs in molecules, and thus generally has difficulty in exhibiting sufficient hydrophilicity. In contrast, a polymer material comprising a polymer containing heteroatoms (oxygen, nitrogen, etc.) is more likely to cause polarization stemming from their heteroatoms, and generally has sufficiently high hydrophilicity. Here, a highly hydrophilic polymer material can achieve a high moisture content under a use environment (usually under conditions at room temperature (about 25° C.) and normal humidity), and thus can be made to have hygroscopicity efficiently by drying to sufficiently remove the internal moisture. For this reason, in the case where such a polymer material comprising a polymer containing heteroatoms other than carbon and hydrogen is used as a material for a base material, a gas-barrier multilayer film having a higher hygroscopicity can be produced more efficiently, and the gas-barrier multilayer film thus produced can exhibit higher water vapor permeation prevention performance when used as a substrate for an organic EL device. Here, a preferable heteroatom in such a polymer containing heteroatoms other than carbon and hydrogen is an oxygen atom because such a base material, when used in a gas-barrier multilayer film, enables the film to exhibit a high hygroscopicity.

As such an organic polymer material, polyesters having ester bonds are preferable from the following viewpoints. Specifically, a colorless and transparent base material can be obtained. Moreover, the polyester is a polymer containing heteroatoms other than hydrogen and therefore is capable of exhibiting a high hygroscopicity when used after drying or the like, so that the polyester can impart higher water vapor permeation prevention performance to the transparent support substrate 1. Among the polyesters, it is particularly preferable to use a polyester having a benzene ring (for example, PET (polyethylene terephthalate) or PEN (polyethylene naphthalate)) from the viewpoints that the base material can be enhanced in the transparency and the workability in film formation, and can be further improved also in the strength and the heat resistance.

In addition, the thickness of such a base material is not particularly limited. In the case of forming a thin film layer directly on a surface of the base material, however, it is preferable to set the thickness appropriate for film deposition depending on a kind of the thin film layer to be formed thereon. For example, the thickness of the base material is preferably 5 to 500 µm, because the base material with such a thickness can be conveyed in vacuum in the process of forming a thin film layer on a surface of the base material and thus the thin film can be formed on the surface of the base material under vacuum conditions. Moreover, the thickness of the base material is more preferably 50 to 200 µm and most preferably 50 to 100 µm from the viewpoint that, in the case of forming the thin film layer by using a plasma CVD method, such a thickness allows use of a method of forming the thin film layer by performing electric discharge through the base material.

Further, the thickness of the base material has the following nature. Specifically, for example, in a case where members in each of which a thin film layer is formed on a base material are bonded together to produce a gas-barrier multilayer film, the bonding step is not particularly affected by the thickness of the base material. Thus, regardless of the method of producing the gas-barrier multilayer film, a base material with any thickness can be used without particular limitation, if the thickness allows a thin film layer to be deposited. In other words, the thickness of the base material may be designed as appropriate as long as the thickness allows a thin film layer to be formed on a surface of the base material, and enables the base material to satisfactorily support the thin film layer.

Meanwhile, the gas-barrier multilayer film in the embodiment illustrated in FIG. 2 includes two thin film layers called the first thin film layer 101(*a*) and the second thin film layer 101(*b*). Here, in the case where the number of such thin film layers is only one (in the case of a structure in which the gas-barrier multilayer film does not include any one of the first thin film layer and the second thin film layer), it tends to be so difficult to inhibit deterioration of the organic EL device at a sufficiently high level that the deterioration proceeds at faster speed and the storage life becomes shorter than in the case where the number of thin film layers is two or more. For example, assume that only the first thin film layer 101(*a*) is present in the embodiment illustrated in FIG. 2. In this case, even if the gas-barrier multilayer film is produced through a step of drying the first base material, the absence of a barrier layer on the surface of the gas-barrier multilayer film opposite to the surface covered with the first thin film layer having gas barrier properties tends to facilitate permeation of moisture into the first base material from the surface opposite to the surface covered with the first thin film layer having gas barrier properties, and a time until the moisture content in the base material reaches a saturated moisture content tends to be significantly shortened. Therefore, even if the drying step is carried out during the production, the effect of drying tends to fail to be fully utilized. Also, in the case where only the second thin film layer is present in the embodiment illustrated in FIG. 2, an organic EL is formed directly on the first base material, and the moisture inside the base material tends to directly deteriorate the organic EL.

Moreover, both the first thin film layer 101(*a*) and the second thin film layer 101(*b*) need to be layers formed of thin films having gas barrier properties (thin film layers). The "gas barrier properties" mentioned herein may be properties that satisfy at least one of the following requirements (A) to (C):

[Requirement (A)]

as a result of comparison of a "gas-transmission rate of base material (unit: mol/m$^2$·s·P)" and a "gas-transmission rate of base material with thin film layer formed (unit: mol/m$^2$·s·P)" measured by a method in accordance with JIS K 7126 (issued in 2006), the "gas-transmission rate of base material with thin film layer formed" takes a value smaller by two or more digits than (a value of 1/100 or less of) a value of the "gas-transmission rate of base material";

[Requirement (B)]

as a result of comparison of a "water vapor permeability of base material (unit: g/m$^2$·s·P)" and a "water vapor permeability of base material with thin film layer formed (unit: g/m$^2$·s·P)" measured by a method in accordance with JIS K 7129 (issued in 2008), the "water vapor permeability of the base material with thin film layer formed" takes a value smaller by two or more digits than (a value of 1/100 or less of) a value of the "water vapor permeability of base material"; and

[Requirement (C)]

as a result of comparison of a "water vapor permeability of the base material (unit: g/m$^2$·s·P)" and a "water vapor permeability of base material with thin film layer formed (unit: g/m$^2$·s·P)" measured by a method in accordance with a method described in Japanese Unexamined Patent Application Publication No. 2005-283561 (JP 2005-283561 A), the "water vapor permeability of base material with thin film layer formed" takes a value smaller by two or more digits than (a value of 1/100 or less of) a value of the "water vapor permeability of base material". Note that the water vapor permeability of a base material with a thin film layer having water vapor barrier properties (gas barrier properties) formed thereon generally has a value of 10$^{-2}$ g/m$^2$/day or less. For this reason, when the above requirements (B) and (C) are examined, the "water vapor permeability of base material with thin film layer formed" preferably has a value of 10$^{-2}$ g/m$^2$/day or less. Moreover, it is more preferable that such a thin film layer having gas barrier properties satisfy the above requirement (C).

Moreover, such a thin film layer having gas barrier properties has a thickness preferably in a range of 5 to 3000 nm, more preferably in a range of 10 to 2000 nm, and most preferably in a range of 100 to 1000 nm. When the thickness of the thin film layer is smaller than the above lower limit, the thin film layer tends to have poor gas barrier properties such as oxygen gas barrier properties and water vapor barrier properties. On the other hand, when the thickness of the thin film layer is larger than the above upper limit, the thin film layer tends to easily degrade the gas barrier properties due to bending.

As for a kind of each of the first and second thin film layers having gas barrier properties, any publicly-known thin films having gas barrier properties may be used as needed without particular limitation. Each of these thin film layers is preferably a thin film layer containing at least one of metal oxides, metal nitrides, and metal oxynitrides.

In addition, each of the first and second thin film layers may be a multilayer film including an organic layer/an inorganic layer/an organic layer, an inorganic layer/an organic layer/an inorganic layer, or the like which are laminated on the base material. In this case, the inorganic layer mainly exhibits the gas barrier properties. A preferable composition of the inorganic layer is any of metal oxides, metal nitrides, metal oxynitrides, silicon oxides, and silicon oxide carbides described below. The organic layer relaxes a stress between the base material and the inorganic layer, or produces an effect of smoothing the upper surface of the base material by being embedded between the asperities and particles on the upper surface. Further, the organic layer may have a water capturing function. A preferable composition of the organic layer is any of organic materials usable for a thermosetting adhesive, a photocurable adhesive, a two-component curable adhesive, and the like, which are mentioned below. Note that the kinds of the first thin film layer 101(*a*) and the second thin film layer 101(*b*) may be the same as or different from each other.

Then, the metal oxide, the metal nitride and the metal oxynitride to be used for such a thin film layer is preferably deposited by a method such as a sputtering method, a vacuum deposition method, an ALD (atomic layer deposition) method, and an ion plating method, from the viewpoint that higher water vapor permeation prevention performance can be exhibited with a thinner film, and from the viewpoints of transparency and the like. From the viewpoints of ease of production and low production cost, the sputtering method and the ALD method are more preferable.

Further, the thin film layer is more preferably a layer formed of a thin film containing at least silicon and oxygen from the viewpoint that the film can exhibit higher water vapor permeation prevention performance and from the viewpoints of flexing endurance, ease of production, and low production cost. Moreover, the layer formed of a thin film containing silicon and oxygen is preferably a thin film layer formed by using a plasma chemical vapor deposition method or a thin film formation method of forming a precursor on a base material surface and performing a plasma treatment. Among such thin film layers, a particularly preferable thin film layer is a silicon oxide-based thin film layer containing silicon, oxygen and carbon, and satisfying all the following requirements (i) to (iii) in a silicon distribution curve, an oxygen distribution curve, and a carbon distribution curve, each of the silicon, oxygen, and carbon distribution curves representing the relationship between the distance from a surface of the layer in the film thickness direction of the layer and corresponding one of the ratio of the amount of silicon atoms to the total amount of silicon atoms, oxygen atoms, and carbon atoms (the atomic ratio of silicon), the ratio of the amount of oxygen atoms to said total amount (the atomic ratio of oxygen), and the ratio of the amount of carbon atoms to said total amount (the atomic ratio of carbon):

(i) the atomic ratio of silicon, the atomic ratio of oxygen, and the atomic ratio of carbon satisfy, in any region corresponding to 90% or more of the film thickness of the layer, a requirement represented by the following formula (1):

(atomic ratio of oxygen)>(atomic ratio of silicon)>(atomic ratio of carbon)   (1);

(ii) the carbon distribution curve has at least one extremum; and (iii) the absolute value of the difference between the maximum value and the minimum value of the atomic ratio of carbon in the carbon distribution curve is 5 at % or greater.

Such a silicon oxide-based thin film layer, first of all, is required to satisfy the following. Specifically, in a silicon distribution curve, an oxygen distribution curve, and a carbon distribution curve, each of the silicon, oxygen, and carbon distribution curves representing the relationship between the distance from a surface of the layer in the film thickness direction of the layer and corresponding one of the ratio of the amount of silicon atoms to the total amount of silicon atoms, oxygen atoms, and carbon atoms (the atomic ratio of silicon), the ratio of the amount of oxygen atoms to said total amount (the atomic ratio of oxygen), and the ratio of the amount of carbon atoms to said total amount (the atomic ratio of carbon):

(i) in any region corresponding to 90% or more (more preferably 95% or more, and particularly preferably 100%) of the thickness of the layer, the atomic ratio of silicon, the atomic ratio of oxygen, and the atomic ratio of carbon satisfy a requirement represented by the following formula (1):

(atomic ratio of oxygen)>(atomic ratio of silicon)>(atomic ratio of carbon)  (1).

If the atomic ratio of silicon, the atomic ratio of oxygen, and the atomic ratio of carbon do not satisfy the requirement, the obtained gas-barrier multilayer film has insufficient gas barrier properties.

Next, in such a silicon oxide-based thin film layer, (ii) the carbon distribution curve needs to have at least one extremum. In such a silicon oxide-based thin film layer, the carbon distribution curve has more preferably at least two extrema, and particularly preferably at least three extrema. If the carbon distribution curve has no extremum, the obtained gas-barrier multilayer film exhibits insufficient gas barrier properties when the film is bent. Moreover, when the carbon distribution curve has at least three extrema as described above, the absolute value of the difference in distance from the surface of the thin film layer in the film thickness direction of the thin film layer between each of the extrema of the carbon distribution curve and any one of the extrema adjacent to the former one is preferably 200 nm or less, and more preferably 100 nm or less. Note that, in the present invention, an extremum refers to a local maximum or a local minimum of the atomic ratio of an element with respect to the distance from a surface of the silicon oxide-based thin film layer in the film thickness direction of the thin film layer. Moreover, in the present invention, the local maximum refers to a point at which change of the value of the atomic ratio of an element turns from increase to decrease when the distance from the surface of the silicon oxide-based thin film layer is changed and the value of the atomic ratio of the element decreases by 3 at % or more in comparison to the value of the atomic ratio of the element at that point when the distance from the surface of the thin film layer in the film thickness direction of the thin film layer is further changed by 20 nm from that point. Meanwhile, in the present invention, the local minimum refers to a point at which the change of the value of the atomic ratio of an element turns from decrease to increase when the distance from the surface of the silicon oxide-based thin film layer is changed and the value of the atomic ratio of the element increases by 3 at % or more in comparison to the value of the atomic ratio of the element at that point when the distance from the surface of the thin film layer in the film thickness direction of the thin film layer is further changed by 20 nm from that point.

Moreover, in such a silicon oxide-based thin film layer, (iii) the absolute value of the difference between the maximum value and the minimum value of the atomic ratio of carbon in the carbon distribution curve needs to be 5 at % or greater. In addition, in such a thin film layer, the absolute value of the difference between the maximum value and the minimum value of the atomic ratio of carbon is more preferably 6 at % or greater, and particularly preferably 7 at % or greater. If the absolute value is smaller than 5 at %, the gas barrier properties of the obtained gas-barrier multilayer film are insufficient when the film is bent.

Moreover, in the silicon oxide-based thin film layer, the oxygen distribution curve of the thin film layer preferably has at least one extremum, more preferably at least two extrema, and particularly preferably at least three extrema. If the oxygen distribution curve has no extremum, the obtained gas-barrier multilayer film tends to exhibit low gas barrier properties when the film is bent. Moreover, when the oxygen distribution curve has at least three extrema as described above, the absolute value of the difference in distance from the surface of the thin film layer in the film thickness direction of the thin film layer between each of the extrema of the carbon distribution curve and any one of the extrema adjacent to the former one is preferably 200 nm or less, and more preferably 100 nm or less.

Moreover, in the silicon oxide-based thin film layer, the absolute value of the difference between the maximum value and the minimum value of the atomic ratio of oxygen in the oxygen distribution curve of the thin film layer is preferably 5 at % or greater, more preferably 6 at % or greater, and particularly preferably 7 at % or greater. If the absolute value is smaller than the lower limit, the gas barrier properties of the obtained gas-barrier multilayer film tend to be low when the film is bent.

In the silicon oxide-based thin film layer, the absolute value of the difference between the maximum value and the minimum value of the atomic ratio of silicon in the silicon distribution curve of the thin film layer is preferably smaller than 5 at %, more preferably smaller than 4 at %, and particularly preferably smaller than 3 at %. If the absolute value exceeds the upper limit, the gas barrier properties of the obtained gas-barrier multilayer film tend to decrease.

Moreover, in the silicon oxide-based thin film layer, in an oxygen-carbon distribution curve which represents the relationship between the distance from the surface of the layer in the film thickness direction of the layer and the ratio of the total amount of oxygen atoms and carbon atoms to the total amount of silicon atoms, oxygen atoms, and carbon atoms (the atomic ratio of oxygen and carbon), the absolute value of the difference between the maximum value and the minimum value of the total atomic ratio of oxygen and carbon is preferably smaller than 5 at %, more preferably smaller than 4 at %, and particularly preferably smaller than 3 at %. If the absolute value exceeds the upper limit, the gas barrier properties of the obtained gas-barrier multilayer film tend to decrease.

The silicon distribution curve, the oxygen distribution curve, the carbon distribution curve, and the oxygen-carbon distribution curve can be produced by the so-called XPS depth profile measurement; in the XPS depth profile measurement, measurement by X-ray photoelectron spectroscopy (XPS) and noble gas ion sputtering using argon or the like are conducted in combination to conduct a sequential surface composition analysis while the inside of a sample is being made to be exposed. A distribution curve obtained by such XPS depth profile measurement can be produced by, for example, taking the atomic ratio of each element (unit: at %) on the vertical axis and the etching time (sputtering time) on the horizontal axis. Note that, in an element distribution curve where the horizontal axis represents the etching time as described above, the etching time approximately correlates to the distance from the surface of the thin film layer in the film thickness direction of the thin film layer in the film thickness direction. Hence, a distance from the surface of the thin film layer calculated from a relationship between the etching rate and the etching time employed in the XPS depth profile measurement can be employed as the "distance from the surface of the thin film layer in the film thickness direction of the thin film layer". Moreover, regarding the sputtering method employed for the XPS depth profile measurement, it is preferable to employ a noble gas ion sputtering method using argon (Ark) as an etching ion species, and set the etching rate to 0.05 nm/sec (in terms of $SiO_2$ thermally oxidized film).

Moreover, from the viewpoint of forming a silicon oxide-based thin film layer having gas barrier properties which are excellent and constant over the entire film surface, the thin film layer is preferably substantially uniform in the film surface direction (the direction in parallel to a surface of the thin film layer). In this DESCRIPTION, the phrase "the silicon oxide-based thin film layer is substantially uniform in the film surface direction" means that when the oxygen distribution curves, the carbon distribution curves, and the oxygen-carbon distribution curves are produced for any two measurement points on the film surface of the thin film layer by XPS depth profile measurement, the carbon distribution curves obtained at the two measurement points have the same number of extrema and the carbon distribution curves have the same absolute value of the difference between the maximum value and the minimum value of the atomic ratio of carbon or have absolute values which are different by 5 at or less.

Moreover, in the silicon oxide-based thin film layer, the carbon distribution curve of the layer is preferably substantially continuous. In this DESCRIPTION, the phrase "the carbon distribution curve is substantially continuous" means that no portion exists at which the atomic ratio of carbon changes discontinuously in the carbon distribution curve. Specifically, the relationship between the distance (x, unit: nm) from the surface of at least one layer of the thin film layer(s) in the film thickness direction of the layer calculated from the etching rate and the etching time, and the atomic ratio of carbon (C, unit: at %) satisfy a requirement represented by the following formula (F1):

$$(dC/dx) \leq 0.5 \quad (F1).$$

Moreover, when the atomic ratio of silicon, the atomic ratio of oxygen, and the atomic ratio of carbon in the silicon, oxygen, and carbon distribution curves satisfy the requirement represented by the above-described formula (1) in any region corresponding to 90% or more of the film thickness of the layer, the atomic ratio of the content of silicon atoms in the layer to the total amount of silicon atoms, oxygen atoms, and carbon atoms is preferably 25 to 45 at %, and more preferably 30 to 40 at %. In addition, the atomic ratio of the content of oxygen atoms in the silicon oxide-based thin film layer to the total amount of silicon atoms, oxygen atoms, and carbon atoms is preferably 33 to 67 at %, and more preferably 45 to 67 at %. Moreover, the atomic ratio of the content of carbon atoms in the silicon oxide-based thin film layer to the total amount of silicon atoms, oxygen atoms, and carbon atoms is preferably 3 to 33 at %, and more preferably 3 to 25 at %.

Moreover, when the atomic ratio of silicon, the atomic ratio of oxygen, and the atomic ratio of carbon in the silicon, oxygen, and carbon distribution curves satisfy the requirement represented by the above-described formula (2) in any region corresponding to 90% or more of the thickness of the layer, the atomic ratio of the content of silicon atoms in the layer to the total amount of silicon atoms, oxygen atoms, and carbon atoms is preferably 25 to 45 at %, and more preferably 30 to 40 at %. In addition, the atomic ratio of the content of oxygen atoms in the silicon oxide-based thin film layer to the total amount of silicon atoms, oxygen atoms, and carbon atoms is preferably 1 to 33 at %, and more preferably 10 to 27 at %. Moreover, the atomic ratio of the content of carbon atoms in the silicon oxide-based thin film layer to the total amount of silicon atoms, oxygen atoms, and carbon atoms is preferably 33 to 66 at %, and more preferably 40 to 57 at %.

In addition, the silicon oxide-based thin film layer is preferably a layer formed by a plasma chemical vapor deposition method. Such a thin film layer formed by the plasma chemical vapor deposition method is more preferably a layer formed by a plasma chemical vapor deposition method in which the base material is placed on the pair of film forming rolls and plasma is generated by performing discharge between the pair of film forming rolls. In addition, during the discharge between the pair of film forming rolls as described above, the polarities of the pair of film forming rolls are preferably reversed alternately. Moreover, as a film-forming gas used for the plasma chemical vapor deposition method, a gas containing an organosilicon compound and oxygen is preferable. The content of oxygen in the film-forming gas is preferably not more than a theoretical amount of oxygen necessary to completely oxidize the entire amount of the organosilicon compound in the film-forming gas. In addition, the thin film layer is preferably a layer formed by a continuous film formation process. Note that such a silicon oxide-based thin film layer may be produced by using a method described in JP 2011-73430 A.

Further, preferably at least one of the first thin film layer 101(a) and the second thin film layer 101(b) is a silicon oxide-based thin film layer because higher water vapor permeation prevention performance can be exhibited. More preferably, both of them are silicon oxide-based thin film layers.

Moreover, the gas-barrier multilayer film (transparent support substrate 1) in the embodiment illustrated in FIG. 2 includes an adhesive layer 102. Preferable adhesives usable to form the adhesive layer 102 are curable adhesives such as thermosetting adhesives, photocurable adhesives, and two-component curable adhesives from the viewpoints of ease of production and low-volatility component.

As such a thermosetting resin adhesive, any publicly-known thermosetting resin adhesive may be used as needed without particular limitation. As such thermosetting resin adhesives, there are epoxy adhesives, acrylate adhesives, and so on. An example of such epoxy-based adhesives is an adhesive containing an epoxy compound selected from bisphenol A epoxy resins, bisphenol F epoxy resins, and phenoxy resins. Meanwhile, an example of such acrylate-based adhesives is an adhesive containing a monomer as a main component selected from acrylic acid, methacrylic acid, ethyl acrylate, butyl acrylate, 2-hexyl acrylate, acrylamide, acrylonitrile, hydroxyl acrylate, and the like, and a monomer copolymerizable with the main component.

Meanwhile, as the photocurable adhesive, any publicly-known photocurable adhesive can be used as needed without particular limitation, and may be, for example, any of radical adhesives, cationic adhesives, and the like. Examples of such radical adhesives include adhesives containing epoxy acrylate, ester acrylate, ester acrylate, and the like. Then, examples of such cationic adhesives include adhesives containing epoxy-based resins, vinyl ether-based resins, and the like.

Moreover, the adhesive layer 102 may further contain a moisture adsorbent (so-called a drying agent or desiccant), a bluing agent, an ultraviolet absorber, an antioxidant, or the like. When the multilayer film is used as a substrate of an organic EL for illumination, the adhesive layer 102 may contain a dye or pigment of the same color as the color of light emitted by the organic EL, or may contain a dye or pigment of a different color from the color of light emitted by the organic EL with the intention of producing a color mixing effect. Further, in order to produce a light scattering effect or a light extraction effect, the adhesive layer 102 may contain inorganic particles or the like having a different optical refraction index from that of the adhesive layer.

It is preferable that the adhesive layer 102 contain a moisture adsorbent with the following intentions. Specifically, when the adhesive contains moisture, the moisture adsorbent can reduce the moisture in the adhesive layer and thereby satisfactorily inhibit the performance from deteriorating due to the moisture generated from the adhesive layer. In addition, the moisture adsorbent allows the gas-barrier multilayer film to exhibit higher hygroscopic performance and thereby allows the gas-barrier multilayer film to exhibit higher water vapor permeation prevention performance. Such a moisture adsorbent (drying agent) is not particularly limited, but may be, for example, a metal oxide such as silica gel, zeolite (molecular sieve), magnesium oxide, calcium oxide, barium oxide, or strontium oxide; a metal hydroxide such as dried aluminum hydroxide; or the like. Among these moisture adsorbents (drying agents), calcium oxide and dried aluminum hydroxide are particularly preferable from the viewpoints of sufficiently high light transmittance and the like.

As such a moisture adsorbent (drying agent), a particulate adsorbent is preferable. Such a particulate moisture adsorbent (drying agent) has an average particle diameter in the range of preferably 0.01 to 10 μm (more preferably 0.01 to 5 μm, and even more preferably 0.1 to 5 μm). When the average particle diameter is less than 0.01 μm, the primary particles tend to aggregate easily and form large aggregated particles (secondary particles). In addition, having too strong hygroscopic power, the moisture adsorbent, when added to the adhesive layer, already completes moisture absorption fully and cannot exhibit the hygroscopic ability anymore. On the other hand, when the average particle diameter exceeds 10 μm, the adhesive tends to have difficulty in forming a smooth layer when formed into a film form, and to fail to obtain a sufficient hygroscopic ability.

Moreover, the content of such a moisture adsorbent (drying agent) is not particularly limited, but is preferably 5 to 50% by mass in the adhesive (more preferably 10 to 30% by mass). If the content of the absorbent (drying agent) is less than the above lower limit, the moisture supply ability tends to be lowered because the adsorbent fully absorbs the moisture contained in the adhesive. On the other hand, when the content exceeds the above upper limit, the light transmittance tends to decrease, and accordingly reduce light extraction from the luminescent layer of the organic EL.

In addition, such an adhesive layer 102 preferably contains, for example, a bluing agent depending on the use of the organic EL device. Such a bluing agent is not particularly limited, but any publicly-known bluing agent can be suitably used as needed such for example as Macrolex Violet B and Macrolex Blue RR manufactured by Bayer AG and Terazole Blue RLS and Triazole Blue RLS manufactured by Sandoz Ltd. Moreover, Solvent Violet-3, Solvent Blue-94, Solvent Blue-78, Solvent Blue-95, Solvent Violet-13 and the like according to color index classification can also be used.

Then, the thickness of such an adhesive layer 102 is not particularly limited. However, if a solid content such as powder (for example, the foregoing moisture adsorbent (drying agent), optical refraction index control particles or the like) is added to the adhesive and particles constituting the powder (powder particles) do not aggregate in nature, the thickness of the adhesive layer 102 is preferably approximately equal to the maximum diameter of the primary particle diameter of the powder particles, and more preferably 1 to 20 μm in general in this case. On the other hand, in the case where the powder particles aggregate in nature, the thickness of the adhesive layer 102 is preferably approximately equal to the maximum diameter of the secondary particle diameter of the powder particles, and more preferably 5 to 50 μm in general in this case. Alternatively, if no solid content such as powder is added to the adhesive and the adhesive layer 102 is formed by applying and drying the adhesive, the thickness of the adhesive layer 102 is preferably 0.2 to 30 μm and more preferably 0.5 to 10 μm from the viewpoints of adhesion strength and processing workability. Instead, if an adhesive in a film form (adhesive film) is used to form the adhesive layer 102, the thickness of the adhesive layer 102 is preferably 1 to 100 μm and more preferably 5 to 50 μm from the viewpoint of processing workability.

In addition, an adhesive processed in a film form (sheet) may be used to form such an adhesive layer. In this case, such an adhesive film with a film thickness of 100 μm in an environment at 60° C. and 90 RH % preferably has a water vapor permeability of 100 $g/m^2$/day or less (more preferably 30 $g/m^2$/day or less), and a light transmittance of 70% or more (more preferably 80% or more). If the water vapor permeability exceeds the above upper limit, the moisture permeation from portions of the end faces of the gas-barrier multilayer film where the adhesive portions are exposed increases so much that a time until the moisture content in the first base material reaches the saturated content tends to be shortened, and consequently the storage life of the organic EL tends to be shorten. Meanwhile, if the light transmittance is less than the above lower limit, the internal light cannot be sufficiently emitted to the outside, whereby the light emission efficiency of the organic EL tends to be lowered. Note that, as the water vapor permeability, it is possible to employ a value measured by, for example, a calcium-light transmittance method (when absorbing moisture, Ca metal is changed to calcium oxide, calcium hydroxide or the like, and accordingly the light transmittance changes), a MOCON's water vapor transmission rate (WVTR) testing system, or the like. Meanwhile, the light transmittance can be measured by an optical thin film metrology system device manufactured by Film-Tek Corporation (United States) or the like.

Still further, the adhesive layer is preferably a layer in which the ratio of the optical refraction index of the first base material layer 100(a) to the optical refraction index of the adhesive layer ([optical refraction index of first base material layer 100(a)]/[optical refraction index of adhesive layer]) is 0.88 to 1.18 (more preferably 1.01 to 1.11). If the ratio between the optical refraction indexes is less than the above lower limit, the refraction index of the adhesive layer needs to be further increased, and the light emitted to the outside tends to decrease when the optical refraction index of the adhesive layer is more than that of the second thin film layer. On the other hand, if the ratio exceeds the above upper limit, the light is largely reflected at the interface between the first base material and the adhesive layer, and accordingly the emission of light from the luminescent layer to the outside tends to decrease. Note that the optical refraction index can be measured by, for example, an optical thin film metrology system device manufactured by Film-Tek Corporation (United States), a general-purpose ellipsometeror, or the like.

Additionally, the gas-barrier multilayer film (transparent support substrate 1) in the embodiment illustrated in FIG. 2 has the multilayer structure in which the thin film layer 101(*a*), the base material layer 100(*a*), the adhesive layer 102, the thin film layer 101(*b*), and the base material layer 100(*b*) are layered in this order. With this multilayer structure, the light emitting element to be described later is directly stacked on the surface of the thin film layer, and the thin film layer can highly inhibit water vapor from permeating the inside of the element.

The entire thickness of such a gas-barrier multilayer film (transparent support substrate 1) is preferably 50 to 300 μm and more preferably 100 to 2500 μm. If a gas-barrier multilayer film with a film thickness less than the above lower limit is formed to be a long base material, the film tends to be difficult to control because the film is more likely to be wrinkled or twisted in manufacturing steps of an organic EL device. On the other hand, if the thickness of a base material layer is larger than the foregoing upper limit, the film tends to absorb an increased amount of light and thereby to reduce the light emission from the luminescent layer to the outside. In addition, if the thickness of the gas-barrier multilayer film is larger than the above upper limit, water vapor is more likely to permeate the base material layer from directions parallel to the surface of the gas-barrier multilayer film (from the end sides: directions perpendicular to the end faces). For this reason, for example, if a base material and the like in a dry state are used in the production of the gas-barrier multilayer film, the dry state of the base material tends to be difficult to keep satisfactorily for a long period of time.

Moreover, the gas-barrier multilayer film preferably has such a hygroscopicity that the film can absorb water in a weight of 0.1% by mass or more of its own weight (the mass of the gas-barrier multilayer film itself) (more preferably 0.2% by mass or more of its own weight). If this hygroscopicity is less than the above lower limit, it tends to be difficult for the gas-barrier multilayer film to exhibit further higher moisture permeation prevention performance. The hygroscopicity of the gas-barrier multilayer film is preferably 5% by mass or less of its own weight from the viewpoints of a load applied on the base material during drying, a time period required for drying, a decrease in the adhesiveness of the adhesive layer with an increase in the amount of the hygroscopic agent, and so on. This hygroscopicity is more preferably 3% by mass or less of its own weight, and even more preferably 2% by mass or less of its own weight.

Here, the hygroscopicity of the gas-barrier multilayer film can be measured as follows. Specifically, first, a gas-barrier multilayer film (50 mm square film) is prepared with both a length of 50 mm and a width of 50 mm (50 mm square) for measurement of the hygroscopicity of the gas-barrier multilayer film. Next, the 50 mm square film is cut at 1 mm pitches into rectangular pieces. Thus, rectangular samples in the size with a length of 50 mm and a width of 1 mm are prepared. Next, the mass (unit: g) of the rectangular samples (50 samples) with a length of 50 mm and a width of 1 mm is precisely measured down to four decimal places at a room temperature (25° C.) in atmospheric air in a thermostatic chamber. The mass thus measured is used as the film's own weight (W1: an initial mass before use) mentioned above. Subsequently, the 50 samples are allowed to stand in an atmosphere at constant temperature and constant humidity (25° C., humidity of 50%, a humidity ratio of 10 g/kg), and the mass of the samples is precisely measured down to four decimal places every 24 hours. Such mass measurement is conducted until the mass of the samples (50 samples) becomes constant. Then, the mass taking the constant value is used as Wn. In the present invention, a value obtained by calculating the following formula:

[Ratio of moisture absorption $Bn$]=$\{(Wn-W1)/W1\}\times 100$, based on the values Wn and W1 thus obtained is used as the hygroscopicity of the gas-barrier multilayer film.

Here, this hygroscopicity is a hygroscopicity basically exhibited based on the hygroscopic performance of the base material layer disposed between the first and second thin film layers having gas barrier properties. In order that the base layer disposed between the first and second thin film layers can absorb moisture more sufficiently, the gas-barrier multilayer film is preferably produced by forming, as the base material layer, a layer made of a base material composed of a polymer containing heteroatoms other than hydrogen (more preferably a polyester having an ester bond, and even more preferably PET or PEN), and by disposing the sufficiently dried base material between the first and second thin film layers in the production of the gas-barrier multilayer film.

Moreover, in the gas-barrier multilayer film (transparent support substrate 1) in the embodiment illustrated in FIG. 2, a ratio of the total value of the thicknesses of all the base material layers included in the film to the entire thickness of the film ($\{$[total value of thicknesses of all base material layers]/[entire thickness of gas-barrier multilayer film]$\}\times 100$) is preferably 90% or more and is more preferably 95% or more. If this ratio is less than the above lower limit, the gas-barrier multilayer film tends to have low flexibility, or be reduced in the productivity because the base material is deformed due to a stress applied from the thin film layer formed on the base material.

Further, a ratio of the total value of the thicknesses of all the base material layers present between the first thin film layer and the second thin film layer to the thickness of all the base material layers present in the gas-barrier multilayer film (transparent support substrate 1) in the embodiment illustrated in FIG. 2 ($\{$[total value of thicknesses of all base material layers present between first thin film layer and second thin film layer]/[thickness of all base material layers present in gas-barrier multilayer film]$\}\times 100$) is preferably 50% or more, and is more preferably 90% or more in particular. If the ratio of the thickness of the base material layer(s) between the thin film layers is less than the above lower limit, it tends to be difficult to exhibit sufficiently high hygroscopicity when the base material is dried and is used to exhibit the hygroscopicity.

Moreover, a ratio of the thickness of the base material layer present between the first thin film layer and the second thin film layer to the entire thickness of the gas-barrier multilayer film (transparent support substrate 1) in the embodiment illustrated in FIG. 2 ({[thickness of base material layer present between first thin film layer and second thin film layer]/[entire thickness of gas-barrier multilayer film]}×100) is preferably 50% or more, and is more preferably 90% or more in particular. If the ratio of the thickness of the base material layer between the thin film layers is less than the above lower limit, the mechanical strength of a first film member on which an organic EL element is to be formed tends to be lowered and accordingly increase the possibility that the first base material may be broken, for example, in consecutive steps, and it tends to be difficult to exhibit a sufficiently high hygroscopicity when the base material is dried and is used to exhibit the hygroscopicity.

Further, when the gas-barrier multilayer film (transparent support substrate 1) is used in an organic EL device lamp and display, the lower a value of yellowness index YI, the more preferable. The yellowness index YI is more preferably 10 or less and even more preferably 5 or less. The yellowness index YI can be measured in accordance with JIS K 7373: 2006 by using, as a measurement apparatus, a spectrophotometer capable of calculating tristimulus values XYX.

Further, when the gas-barrier multilayer film (transparent support substrate 1) is used in an organic EL device lamp and display, the higher the total luminous transmittance, the more preferable. From this viewpoint, the total luminous transmittance of the gas-barrier multilayer film is more preferably 80% or more and even more preferably 85% or more. Here, this total luminous transmittance can be measured in accordance with JIS K 7375: 2008 by using, as a measurement apparatus, a transmission measurement apparatus including an integrating-sphere photometer.

Further, when the gas-barrier multilayer film (transparent support substrate 1) is used as a substrate for an organic EL device for an image display apparatus, the lower the haze, the more preferable. The haze is more preferably 10% or less, and even more preferably 5% or less. Meanwhile, when the gas-barrier multilayer film is used as a substrate for an organic EL device for an illumination apparatus, the haze does not matter very much from the viewpoint of the intended use. Rather, in the case where the light emission of an organic EL is uneven due to density variation and unevenness of the light emitting surface, the higher haze can make the unevenness in the light emission less noticeable. From this viewpoint, the gas-barrier multilayer film even with a high haze may be preferably used. Thus, the gas-barrier multilayer film (transparent support substrate 1) can be used with appropriate modification in which the characteristics thereof are designed as needed depending on an intended use of an organic EL device.

As a method suitably usable to produce the gas-barrier multilayer film (transparent support substrate 1) illustrated in FIG. 2, it is preferable to employ, for example, a method including a step (step (A)) of preparing: a first film member which includes a first base material layer and a first thin film layer formed on at least one of the surfaces of the first base material layer and having gas barrier properties; and a second film member which includes a second base material layer and a second thin film layer formed on at least one of the surfaces of the second base material layer and having gas barrier properties, and a step (step (B)) of obtaining a gas-barrier multilayer film by stacking and bonding the second thin film layer of the second film member onto the surface of the base material layer of the first film member with an adhesive. Hereinafter, these steps (A) and (B) will be described one by one.

(Step (A))

Step (A) is a step of preparing the first and second film members. A method for preparing these first and second film members is not particularly limited, but any publicly-known method can be employed as needed. For example, the preparation may be made by employing an appropriate method capable of producing film members (first and second film members) each including a base material layer and a thin film layer having gas barrier properties by forming the thin film layer on at least one of the surfaces of the base material, or film members (first and second film members) may be prepared by using commercially available film members (multilayer bodies) each including a base material and a thin film layer having gas barrier properties. In the case of forming the thin film layer on the base material, any publicly-known method capable of depositing such a thin film layer may be employed as needed, but it is preferable to employ a plasma chemical vapor deposition method (plasma CVD) from the viewpoint of gas barrier properties. Here, the plasma chemical vapor deposition method may be a plasma chemical vapor deposition method of a penning discharge plasma type. Instead, as the method for forming the thin film layer on the base material, it is preferable to employ a method described in JP 2011-73430A. With this method, the foregoing silicon oxide-based thin film layer can be formed on the base material efficiently.

(Step (B))

Step (B) is a step of obtaining the gas-barrier multilayer film by stacking and bonding the second thin film layer of the second film member onto the surface of the base material layer of the first film member with an adhesive.

In this way where the second thin film layer of the second film member is stacked and bonded onto the surface of the base material layer of the first film member with the adhesive, the films thus stacked can have a multilayer structure in which the first thin film layer, the first base material layer, an adhesive layer, the second thin film layer, and the second base material layer are layered in this order.

A method for bonding the first and second film members with an adhesive as described above is not particularly limited, but any publicly-known method capable of bonding film members with an adhesive may be employed as needed. For example, it is possible to employ an appropriate method such as a bonding method including forming a stack in which a sheet made of an adhesive having a low melting point is arranged between the first and second film members, and melting the sheet by heating, and a method of bonding the first and second film members by applying an adhesive to the surfaces to be bonded. Here, temperature and other conditions usable in these methods are not also particularly limited, but optimum conditions may be employed as needed depending on the kinds of the first and second film members, the kind of the adhesive, and so on. Further, it is preferable that this adhesive contain a moisture adsorbent additionally, because the adhesive can exhibit a higher hygroscopicity. Also, the method for applying the adhesive, the thickness of the adhesive applied, and the like are not particularly limited. Specifically, in order that the foregoing layer made of the adhesive can be produced, it is possible to employ, as needed, an optimum method from among publicly-known coating methods (for example, coating methods such as doctor blade, wire bar, die coater, comma coater, gravure coater, screen printing, and ink jet methods), and also its conditions.

Additionally, in the case of bonding the first film member and the second film member together as described above, it is preferable to perform a step of drying at least the first film member (one of the film members) beforehand. If the first film member are the second film member are bonded together while the above requirement is satisfied, it is also possible to more efficiently produce the gas-barrier multilayer film having a sufficient hygroscopicity (preferably a hygroscopicity capable of absorbing water in a weight of 0.1% by mass or more of its own weight).

A method (drying method) usable as the step of drying such a film member is not particularly limited, but any publicly-known method capable of drying such a film member may be employed as needed, and, for example, vacuum drying, heat drying, vacuum heating drying, and other methods may be employed as needed. Among these drying methods, the vacuum heating drying which is a combination of vacuum drying and heat drying is the most preferable from the viewpoint of drying speed. Moreover, conditions (heating condition, pressure condition, and others) for drying by the vacuum drying, the heat drying, or the vacuum heating drying are not particularly limited, but may be set as needed to conditions that enable drying of the film member. Here, in the case where the drying method includes a heating step, the heating temperature is set to preferably 50° C. or higher and particularly preferably 100° C. or higher because the film member can be dried more efficiently. If the drying method is a step of drying while heating (for example, in the case of employing the heat drying or the vacuum heating drying), the upper limit of the heating temperature may be set as needed depending on the kind of the base material and others, and is not particularly limited. However, from the viewpoint of more satisfactorily preventing a deformation of the base material due to a high temperature, the upper limit is set to preferably 200° C. or lower, and more preferably 150° C. or lower.

Instead, if the drying method is a method of drying under a vacuum condition (for example, in the case of employing the vacuum drying or the vacuum heating drying), the pressure condition may just be set to a pressure lower than an atmospheric pressure of 760 mmHg (101325 Pa), and is not particularly limited. However, the pressure condition is set to a pressure lower than 76 mmHg (10132.5 Pa) preferably, and a pressure lower than 7.6 mmHg (1013.25 Pa) more preferably. Note that the "vacuum drying" in this DESCRIPTION may be any drying under reduced pressure lower than the atmospheric pressure of 760 mmHg (101325 Pa).

In the case of employing such a drying method, a drying period for drying the film member is not particularly limited. Depending on the conditions employed, an execution period (drying period) may be changed as needed such that the film member can be dried sufficiently. For example, in the case of drying under the foregoing heating temperature condition and pressure condition (vacuum condition) (the case of vacuum heating drying), the drying period is set to preferably 3 hours (180 minutes) or longer, and more preferably 6 hours (360 minutes) or longer from the viewpoint that the film member can be turned in a more sufficiently dry state. Here, this drying period may be set as needed depending on the thickness and kind of the base material, and so on.

In the case where at least the first film member is dried by the drying step, it is preferable to bond the first and second film members together while a time period for which the dried film member is exposed to an atmosphere having a humidity ratio of 10 g/kg or more is restricted to shorter than one hour.

In bonding the first film member and the second film member together, it is preferable to perform the bonding with the foregoing adhesive containing the moisture adsorbent. In the case of bonding with the adhesive containing the moisture adsorbent as described above, basically the adhesive layer containing the moisture adsorbent is also present together with the base material layer between the thin film layers. If the adhesive layer containing the moisture adsorbent is inserted between the thin film layers, it is possible to dry the first base material layer disposed between the first and second thin film layers with the moisture adsorbent in the adhesive layer. For this reason, in the gas-barrier multilayer film thus obtained, the base material layer present between the thin film layers can be dried also after the bonding, and thus the base material layer can be made to exhibit the hygroscopicity. Since the gas-barrier multilayer film thus obtained includes the adhesive layer containing the moisture adsorbent between the thin film layers, the moisture adsorbent in the adhesive layer itself can be also made to exhibit the hygroscopicity. Thus, the bonding of the first film member and the second film member together with the adhesive layer containing the moisture adsorbent also makes it possible to more efficiently form the gas-barrier multilayer film having a sufficient hygroscopicity (preferably a hygroscopicity capable of absorbing water in a weight of 0.1% by mass or more of its own weight). Here, in the case of bonding the first film member and the second film member together with the adhesive layer containing the moisture adsorbent as described above, the step of drying at least the first film member may be or may not be included before the bonding of the first and second film members, but it is preferable to include the drying step from the viewpoints that the higher hygroscopicity can be exhibited, and the gas-barrier multilayer film (transparent support substrate 1) can be made to exhibit much higher water vapor permeation prevention performance.

Here, in the step of bonding the first and second film members, the first and second film members are preferably bonded together under a temperature condition of 20 to 150° C. If the temperature exceeds the above upper limit, the base material tends to have a damage such as a deformation. On the other hand, if the temperature is lower than the above lower limit, the adhesion between the adhesive and the base material or the thin film layer tends to be lowered to increase a possibility of the occurrence of water vapor permeation from the interface.

By performing step (A) and step (B) as described above, it is possible to obtain the gas-barrier multilayer film (transparent support substrate 1) in the embodiment illustrated in FIG. 2, which is suitably usable in the present invention.

Note that the terms "first", "second", and so on in this DESCRIPTION are used for the sake of convenience for explaining two or more same or equivalent elements (for example, base material layers, thin film layers, film members, and so on), and there is no particular meaning in the numbers indicated by these terms and the order in the explanation (the numbers do not indicate superiority or inferiority). These elements may be the same as or different from each other.

In addition, step (B) may be performed after the light emitting element 2 is formed on the first thin film layer of the first film member as will be described later. Alternatively, step (B) may be performed before the formation of the light emitting element 2, and thereafter the light emitting element 2 may be formed. Instead, the light emitting element 2 may be formed after the drying step of the base material layer of the first film member in the step (B) is performed, or the drying step may be formed after the light emitting element 2 is formed.

[Light Emitting Element 2]

The light emitting element 2 includes a pair of electrodes and a luminescent layer disposed between the electrodes. The pair of electrodes (a first electrode 201 and a second electrode 203) and the luminescent layer 202 disposed between the electrodes, which constitute the light emitting element 2, are not particularly limited, but any electrodes and luminescent layer used in publicly-known organic EL devices may be used as needed. For example, the electrode on the light extraction side may be made transparent or semi-transparent, and the luminescent layer may be formed by using a low molecular and/or high molecular organic luminescent material. Hereinafter, the first electrode 201, the luminescent layer 202, and the second electrode 203 will be described one by one.

(First Electrode 201)

The first electrode 201 is one of anode and cathode electrodes. In the light emitting element 2 in the embodiment illustrated in FIG. 1, the first electrode 201 is formed by using an optically transparent electrode (transparent or semi-transparent electrode) such that the light emitted from the luminescent layer 202 can be outputted to the outside of the element 2. In the embodiment illustrated in FIG. 1, the optically transparent first electrode 201 is used as an anode.

As such an optically transparent first electrode 201 (anode), a thin film made of any of metal oxides, metal sulfides, metals and so on may be used. A film with higher electrical conductivity and higher light transmittance is more preferably employed. As the electrode formed of a thin film made of any of metal oxides, metal sulfides, metals and so on, there are, for example, thin films made of indium oxide, zinc oxide, tin oxide, ITO, indium zinc oxide (abbreviated as IZO), gold, platinum, silver, copper, and so on. Then, a thin film made of ITO, IZO or tin oxide is more preferable as such a thin film made of any of metal oxides, metal sulfides, metals and so on. A method for producing such a thin film made of any of metal oxides, metal sulfides, metals and so on is not particularly limited, but any publicly-known method can be employed as needed, and, for example, a vacuum deposition method, a sputtering method, an ion plating method, a plating method, or the like may be employed.

Instead, the first electrode 201 may be formed by using an organic transparent electrically-conductive film made of polyaniline, a derivative thereof, polythiophene, a derivative thereof, or the like. Alternatively, the first electrode 201 may be a film-form electrode (A) including an optically transparent resin and a wire-shaped conductor disposed inside the optically transparent resin and having electrical conductivity. As the optically transparent resin, a resin having higher light transmittance is more preferable, and for example, there are: polyolefin resins such as low or high density polyethylene, ethylene-propylene copolymers, ethylene-butene copolymers, ethylene-hexene copolymers, ethylene-octene copolymers, ethylene-norbornene copolymers, ethylene-dimethano-octahydronaphthalene copolymers, polypropylene, ethylene-vinyl acetate copolymers, ethylene-methyl methacrylate copolymers, and ionomer resin; polyester resins such as polyethylene terephthalate, polybutylene terephthalate, and polyethylene naphthalate; nylon-6, nylon-6,6, and metaxylene diamine-adipic acid condensation polymers; amide resins such as polymethylmethacrylimide; acrylic resins such as polymethyl methacrylate; styrene-acrylonitrile resins such as polystyrene, styrene-acrylonitrile copolymers, styrene-acrylonitrile-butadiene copolymers, and polyacrylonitrile; hydrophobized cellulose resins such as cellulose triacetate and cellulose diacetate; halogen-containing resins such as polyvinyl chloride, polyvinylidene chloride, polyvinylidene fluoride, and polytetrafluoroethylene; hydrogen bonding resins such as polyvinyl alcohol, ethylene-vinyl alcohol copolymers, and cellulose derivatives; engineering plastic resins such as polycarbonate resin, polysulfone resin, polyethersulfone resin, polyetheretherketone resin, polyphenylene oxide resin, polymethylene oxide resin, polyarylate resin, and liquid crystal resin; and so on. Here, in the case of producing an organic layer on the anode by a coating method or the like, the resin constituting the first electrode 201 is preferably a thermosetting resin, a photocurable resin, or a photoresist material from the viewpoint that the resin is more unlikely to be dissolved into the coating liquid.

Then, the wire-shaped conductor with a small diameter is preferable. The diameter of the wire-shaped conductor is preferably 400 nm or smaller, more preferably 200 nm or smaller, and even more preferably 100 nm or smaller. Since such a wire-shaped conductor diffracts or scatters light passing through the first electrode 201, the wire-shaped conductor accordingly increases the haze value of the first electrode 201 and reduces the light transmittance of the first electrode 201. Use of a wire-shaped conductor having a diameter approximately equal to or smaller than the wavelength of visible light makes it possible to keep the haze value to visible light low and to improve the light transmittance. Here, the diameter of the wire-shaped conductor is preferably 10 nm or more, because the wire-shaped conductor has too high resistance when having too a small diameter. When an organic EL device is used in an illumination apparatus, the first electrode 201 with a high haze value is preferred to be used in some cases, because the illumination apparatus can illuminate a wide range if the haze value of the first electrode 201 is high to some extent. In this way, the optical characteristics of the first electrode 201 can be set as needed depending on an apparatus in which the organic EL device is to be used.

Then, such a film-form electrode (A) may include a single wire-shaped conductor or two or more wire-shaped conductors. The wire-shaped conductor preferably forms a mesh structure in the electrode (A). Specifically, in the electrode (A), it is preferable that one or more wire-shaped conductors be arranged to be intricately interlaced with each other across the entire resin, thereby forming a mesh structure (a two-dimensionally or three-dimensionally spread mesh structure formed by a single wire-shaped conductor interlaced intricately, or multiple wire-shaped conductors arranged in contact with each other). Moreover, such a wire-shaped conductor may be, for example, in a curved line shape or a needle-like shape. When conductors in a curved line shape or a needle-like shape are arranged in contact with each other to form a mesh structure, the first electrode 201 with low volume resistivity can be obtained. This mesh structure may be a regular or irregular structure. It is possible to reduce the volume resistivity of the first electrode 201 by using the wire-shaped conductor(s) forming the mesh structure.

At least part of the wire-shaped conductor is preferably arranged near the surface of the first electrode 201 opposite to the transparent support substrate ion which the first electrode 201 is placed (the surface beside the luminescent layer 202 in the present embodiment). Such arrangement of the wire-shaped conductor can reduce the resistance in the surface portion of the first electrode 201. Here, as preferably-usable materials for such a wire-shaped conductor, there are metals with low resistance such for example as Ag, Au, Cu, Al, and alloys thereof. The wire-shaped conductor can be manufactured by, for example, a method according to N. R. Jana, L. Gearheart and C. J. Murphy (Chm. Commun., 2001, p617 to p618) or a method according to C. Ducamp-Sanguesa, R. Herrera-Urbina, and M. Figlarz (J. Solid State Chem., Vol. 100, 1992, p272 to p280) or the like. Then, such an electrode (A) may have the same structure as an electrode described in Japanese Unexamined Patent Publication Application No. 2010-192472 (JP 2010-192472 A) and the production method thereof may also be a method described in JP 2010-192472 A.

Moreover, the film thickness of the first electrode 201 (anode) may be set as needed by taking account of the required characteristics and easiness of processes, and is, for example, 10 nm to 10 µm, preferably 20 nm to 1 µm, and more preferably 50 nm to 500 nm.

(Luminescent Layer 202)

The luminescent layer 202 may be a layer made of a publicly-known material usable for a luminescent layer (layer having a function to emit light) of an organic EL device. The luminescent layer 202 is preferably a luminescent layer made of an organic material, although the material thereof and others are not particularly limited. Such a luminescent layer made of an organic material is not particularly limited, but is preferably, for example, a layer formed of an organic substance (a low molecular compound and a high molecular compound) which emits fluorescence or phosphorescence as a luminescent material, and a dopant which assists the luminescent material. Here, the high molecular compound mentioned here has a number average molecular weight of $10^3$ or more in terms of polystyrene. Although there is not a particular reason to define the upper limit of this number average molecular weight, the upper limit of the number average molecular weight in terms of polystyrene is preferably $10^8$ or less, in general.

As such a luminescent material (an organic substance which emits fluorescence or phosphorescence), there are, for example, dye-based materials, metal complex-based materials, polymer-based materials, and so on. Such dye-based materials, there are, for example, cyclopendamine derivatives, tetraphenyl butadiene derivative compounds, triphenylamine derivatives, oxadiazole derivatives, pyrazolo quinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, and so on.

As the metal complex-based materials, there are, for example, metal complexes such as aluminum quinolinol complexes, benzoquinoline beryllium complexes, benzoxazolyl zinc complexes, benzothiazole zinc complexes, azomethyl zinc complexes, porphyrin zinc complexes, and europium complexes, which each have, as a central metal, Al, Zn, Be, or etc., or a rare earth metal such as Tb, Eu, Dy, or etc., and have, as a ligand, an oxadiazole structure, a thiadiazole structure, a phenylpyridine structure, a phenylbenzoimidazole structure, a quinoline structure, and so on.

Moreover, as the polymer-based materials, there are, for example, polyparaphenylene vinylene derivatives, polythiophene derivatives, polyparaphenylene derivatives, polysilane derivatives, polyacetylene derivatives, polyfluorene derivatives, polyvinylcarbazole derivative, materials obtained by polymerization of the above-mentioned dye-based and metal complex-based luminescent materials, and so on.

Among such luminescent materials, the materials which emit blue light are distyrylarylene derivatives, oxadiazole derivatives and polymers thereof, polyvinylcarbazole derivatives, polyparaphenylene derivatives, polyfluorene derivatives, and the like. Among these, polymer materials such as polyvinylcarbazole derivatives, polyparaphenylene derivatives, and polyfluorene derivatives are preferable.

Meanwhile, the luminescent materials which emit green light are quinacridone derivatives, coumarin derivatives and polymers thereof, polyparaphenylenevinylene derivatives, polyfluorene derivatives, and the like. Among these, polymeric materials such as polyparaphenylenevinylene derivatives and polyfluorene derivatives are preferable.

In addition, the luminescent materials which emit red light are coumarin derivatives, thiophene ring compounds and polymers thereof, polyparaphenylenevinylene derivatives, polythiophene derivatives, polyfluorene derivatives, and the like. Among these, polymeric materials such as polyparaphenylenevinylene derivatives, polythiophene derivatives, and polyfluorene derivatives are preferable.

Here, a method for producing such a luminescent material is not particularly limited, but any publicly-known method can be employed as needed, and for example, a method described in Japanese Unexamined Patent Application Publication No. 2012-144722 (JP 2012-144722 A) may be employed.

Further, it is preferable to add a dopant to the luminescent layer 202 for the purposes of improving the light emission efficiency, changing the wavelength of light emitted, and doing the like. Examples of such a dopant include perylene derivatives, coumarin derivatives, rubrene derivatives, quinacridone derivatives, squarylium derivatives, porphyrin derivatives, styryl dyes, tetracene derivatives, pyrazolone derivatives, decacyclene, phenoxazone, and the like. Note that the thickness of such a luminescent layer is preferably about 20 to 2000 Å, in general.

A method for forming such a luminescent layer 202 is not particularly limited, but any publicly-known method can be employed as needed. Among such methods for forming the luminescent layer 202, the formation by a coating method is preferable. The coating method is preferable in that the production process can be simplified, and the excellent productivity can be achieved. As such a coating method, there are a casting method, a spin coating method, a bar-coating method, a blade coating method, a roll coating method, gravure printing, screen printing, an inkjet method, and the like. In the case of forming a luminescent layer using the coating method, the luminescent layer with a desired thickness can be formed by: first preparing, as a coating liquid, a composition in a solution state containing a luminescent substance and a solvent; and applying this coating liquid to a desired layer or electrode by using a predetermined one of the aforementioned coating methods, followed by drying it.

(Second Electrode 203)

The second electrode 203 is an electrode having the opposite polarity to the first electrode 201, and is arranged opposed to the first electrode 201. In the embodiment illustrated in FIG. 1, the second electrode is a cathode.

A material for such a second electrode 203 (cathode) is not particularly limited, and any publicly-known material may be used as needed. It is preferable to use a material having a small work function, enabling easy injection of electrons into the luminescent layer, and having high electrical conductivity. In addition, in the organic EL device configured to take out light from the anode side as in the embodiment illustrated in FIG. 1, a material having a high visible light reflectance is preferable as the material for the second electrode 203 (cathode) because light emitted from the luminescent layer can be reflected to the anode side by the cathode and thus taken out more efficiently.

Examples of materials usable for such a second electrode 203 (cathode) include alkali metals, alkaline earth metals, transition metals, Group 13 metals of the periodic table, and so on. More specifically, preferably usable materials for the second electrode 203 (cathode) include: metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more of the foregoing metals; alloys of one or more of the foregoing metals and one of more of gold, silver, platinum, copper, manganese, titanium, cobalt, nickel, tungsten, and tin; or graphite or graphite intercalation compounds; and so on. Examples of the alloys include magnesium-silver alloys, magnesium-indium alloys, magnesium-aluminum alloys, indium-silver alloys, lithium-aluminum alloys, lithium-magnesium alloys, lithium-indium alloys, calcium-aluminum alloys, and so on.

Moreover, as the second electrode 203 (cathode), it is possible to use a transparent electrically-conductive electrode made of an electrically-conductive metal oxide, an electrically-conductive organic substance, and the like. Specifically, the electrically-conductive metal oxide may be any of indium oxide, zinc oxide, tin oxide, ITO, and IZO, and the electrically-conductive organic substance may be any of polyaniline, derivatives thereof, polythiophene, derivatives thereof, and the like. Here, the second electrode 203 (cathode) may be formed of a multilayer body in which two or more layers are layered. In addition, what is termed an electron injection layer may be used as the cathode.

The film thickness of the second electrode 203 (cathode) may be designed as needed by taking account of the required characteristics and easiness of processes, and is not particularly limited. However, the film thickness of the second electrode 203 is preferably 10 nm to 10 μm, preferably 20 nm to 1 μm, and more preferably 50 nm to 500 nm. As a method for producing such a second electrode 203 (cathode), a vacuum deposition method, a sputtering method, a lamination method in which a metal thin film is thermo-compression-bonded, or the like may be employed.

Note that, in the embodiment illustrated in FIG. 1, the second electrode 203 (cathode) is electrically connected to a connecting part (lead electrode 203($a$)) with which the second electrode 203 (cathode) can be electrically connected to the outside. Here, in the embodiment illustrated in FIG. 1, the lead electrode 203($a$) is made of the same material as the first electrode 201. Such a lead electrode 203($a$) may be produced and designed as needed by a publicly-known method. For example, the lead electrode 203($a$) can be easily produced by depositing a pattern for the part to constitute the lead electrode 203($a$) together in the process of forming the first electrode 201.

[Sealing Material Layer 3]

The sealing material layer 3 is disposed on the transparent support substrate 1 so as to cover and seal the light emitting element 2. Such a sealing material layer 3 is a layer disposed on the transparent support substrate 1 so as to seal the light emitting element 2, and a layer made of any publicly-known sealing material (for example, an adhesive sheet having sufficiently low water vapor permeation ability, or the like) may be used as needed. More specifically, such a sealing material layer 3 is a sealing layer covering an area around the light emitting element 2 on the transparent support substrate 1 so as to prevent the light emitting device from coming into contact with outside air. Here, in such sealing, in order for the light emitting element 2 to function as the light emitting device, the light emitting element 2 is sealed excluding connecting parts for electrically connecting the pair of electrodes to the outside [for example, parts of a connection wire and the so-called lead electrode (in the embodiment illustrated in FIG. 1, these parts are the part indicated by 203(3) connected to the second electrode 203 and a part of the first electrode 201 which can be in contact with the outside air (a part of the first electrode drawn to the outside)].

As a sealing material for forming such a sealing material layer 3, any conventionally known suitable material may be used in consideration of adhesiveness, heat resistance, and barrier properties against moisture, oxygen, and the like, and thereby the sealing material layer 3 can be formed as needed. For example, it is possible to use any material, as needed, such as not only epoxy resins, silicone resins, acrylic resins, methacrylic resins, and so on, but also the same materials as those cited as the adhesives usable for forming the above-mentioned adhesive layer. Here, a sheet-shaped sealing material may be also used to form such a sealing material layer 3. Such a sheet-shaped sealing material may be formed by a publicly-known appropriate shape-forming method.

Then, the thickness (t) of the sealing material layer 3 just has to be a thickness that allows the sealing material layer 3 to cover the light emitting element 2 such that the light emitting element 2 can be sealed (the thickness just has to have a value larger than that of the height of the light emitting element 2 from the surface of the transparent support substrate 1). Thus, the thickness (t) is not particularly limited, but is preferably 5 to 120 μm, more preferably 5 to 60 μm, even more preferably 10 to 60 μm, and most preferably 10 to 40 μm. If the thickness t of the sealing material layer (the distance between the transparent support substrate 1 and the sealing substrate 4) is smaller than the above lower limit, the second electrode 203 and the sealing substrate 4 tend to easily come into contact with each other when being bent, so that satisfactory inhibition of a short circuit cannot be achieved and the light-emission performance is also more likely to degrade. Also in this case, when being bent, the second electrode 203 is pressed with the application of pressure by the asperities on the surface of the sealing substrate 4, and thereby tends to come into contact with the first electrode 201 and cause a short circuit. On the other hand, if the thickness t exceeds the above upper limit, the surfaces of the sealing material layer in contact with the outside air increase so much that a large amount of water vapor may permeate in lateral directions of the sealing material layer (directions perpendicular to the thickness direction: directions parallel to the surface of the transparent support substrate 1). Accordingly, the storage life of the organic EL device tends to be shortened. A method for disposing such a sealing material layer 3 to seal the light emitting element 2 will be described later.

[Sealing Substrate 4]

The sealing substrate 4 is disposed on the sealing material layer 3. Since the sealing material layer 3 is disposed to cover the light emitting element 2, the light emitting element 2 and the sealing material layer 3 are present between the light emitting element 2 and the sealing substrate 4. Thus, the sealing substrate 4 is disposed on the sealing material layer 3 such that the light emitting element 2 and the sealing material layer 3 are interposed between the transparent support substrate 1 and the sealing substrate 4. Such a sealing substrate 4 is used for the purpose of more efficiently inhibiting water vapor, oxygen and the like from permeating the inside of the light emitting element 2 from the surface of the sealing material layer 3 (the surface in contact with the sealing substrate 4) opposite to the surface of the sealing material layer 3 in contact with the transparent support substrate 1, and for the purpose of improving heat dissipation.

Such a sealing substrate 4 is set for use based on the arithmetic average of roughness profile Ra of JIS B 0601-1994 such that the surface roughness of a surface S1 of the sealing substrate 4 beside the sealing material layer 3 has a smaller value than the surface roughness of the other surface S2 (the surface roughness of the outer side) of the sealing substrate concerned. If the arithmetic average of roughness profile Ra of the surface S1 of the sealing substrate 4 has a larger value than the arithmetic average of roughness profile Ra of the other surface S2 of the sealing substrate, the organic EL device is more likely to cause a short circuit when being bent, because the asperity shape on the surface S1 of the sealing substrate 4 (a shape of asperities present due to the roughness of the surface) makes damage such as on the light emitting element. For this reason, the sealing substrate 4 is used after being formed such that the arithmetic average of roughness profile Ra of the surface S1 of the sealing substrate 4 beside the sealing material layer 3 has a smaller value than the arithmetic average of roughness profile Ra of the other surface S2 of the sealing substrate concerned. Note that although it is also conceivable to perform a treatment of smoothing the surface roughness of the sealing substrate 4, such a smoothing treatment (for example, polishing, surface treatment, or the like), if carried out, incurs a cost increase and a reduction in the economy in production of the organic EL device to make the mass production difficult. In addition, if the surface is smoothened too much, the sealing substrate 4 is more likely to peel off due to a reduction in the adhesion to the sealing material layer 3, and thereby makes the organic EL device difficult to use over a long term. Moreover, when the surface of the sealing substrate 4 is smoothened, the thermalemissivity tends to be lowered to make heat dissipation difficult. In the present invention, the smoothing treatment on the surface of the sealing substrate 4 does not necessary have to be carried out. Hence, the productivity of the organic EL device can also be enhanced to a sufficiently high level.

In addition, in the present invention, the arithmetic average of roughness profile of the surface S1 of the sealing substrate 4 beside the sealing material layer 3 and the thickness of the sealing material layer 3 need to satisfy a requirement specified by the following formula (I):

$$0.002 < (Ra/t) < 0.2 \quad (I)$$

[in the formula (I), Ra denotes the arithmetic average of roughness profile of JIS B 0601-1994 of the surface of the sealing substrate beside the sealing material layer, and t denotes the thickness of the sealing material layer]. If the ratio (Ra/t) of the arithmetic average of roughness profile Ra to the thickness t of the sealing material layer 3 is 0.002 or less, the surface of the sealing substrate 4 beside the sealing material layer 3 is so smooth that the adhesion to the sealing material layer 3 is too low. As a result, the sealing substrate 4 is more likely to peel off and moisture is more likely to permeate from the interface between the sealing material layer 3 and the surface of the sealing substrate 4 beside the sealing material layer 3 to accelerate a deterioration of the organic EL device. In addition, since the thickness of sealing material layer 3 tends to be large, moisture is likely to permeate from portions, exposed to the outside, at the ends of the sealing material layer 3 to accelerate a deterioration of the organic EL device. On the other hand, if the ratio (Ra/t) is 0.2 or more, asperities on the surface of the sealing substrate 4 beside the sealing material layer 3 are enlarged, whereas the thickness of the sealing material layer 3 is reduced relatively. In this case, when being bent, the second electrode 203 and the sealing substrate 4 may come into contact with each other so easily that a short circuit cannot be satisfactorily inhibited and the light-emission performance tends to degrade more easily. In addition, when the organic EL device is bent, the organic EL device tends to be pressed with application of pressure by the asperities on the surface of the sealing substrate 4, and resultantly come into contact with the first electrode 201 to cause a short circuit. Moreover, since higher effects can be obtained from the same viewpoints, the ratio (Ra/t) of the arithmetic average of roughness profile Ra of the surface S1 of the sealing substrate 4 of a side of the sealing material layer 3 to the thickness t of the sealing material layer 3 is preferably in a range of 0.003 to 0.03, and more preferably in a range of 0.005 to 0.01. Note that the thickness t of the sealing material layer 3 is a thickness measured from the surface of the transparent support substrate 1, and has the same value as the distance between the transparent support substrate 1 and the sealing substrate 4.

The arithmetic average of roughness profile Ra of the surface S1 of the sealing substrate 4 beside the sealing material layer 3 is preferably 0.1 to 1.0 μm and more preferably 0.2 to 0.5 μm. If the surface S1 has an arithmetic average of roughness profile Ra less than the above lower limit, the surface S1 tends to deteriorate not only in the adhesion to the sealing agent layer 3 but also in the heat dissipation performance. On the other hand, if the surface S1 has an arithmetic average of roughness profile Ra exceeding the above upper limit, the peaks of the asperities on the surface pierce through the sealing material layer when the organic EL device is being bent, with the results that the device is likely to cause a short circuit and the sealing base material 4 and the second electrode 203 are likely to come into contact with each other to cause a short circuit. Moreover, in the case where a device has a structure in which the sealing substrate 4 can be seen through the transparent support substrate 1, the device tends to appear slightly dull due to light reflection. In contrast, if the arithmetic average of roughness profile Ra is the above upper limit or less, the device having the structure in which the sealing substrate 4 can be seen through the transparent support substrate 1 tends to improve in design beautifulness because the surface roughness of the surface S1 of the sealing substrate which can be seen through the transparent support substrate 1 is constituted by relatively small surfaces.

The arithmetic average of roughness profile Ra of the outer surface S2 of the sealing substrate 4 is preferably 0.25 to 3.8 μm, and is more preferably 0.5 to 2.5 μm. If the arithmetic average of roughness profile Ra of the surface S2 is less than the above lower limit, the surface area of the surface S2 becomes smaller and heat generated in the light emitting element can be dissipated only in a smaller amount to the outside. As a result, the organic EL device tends to have a high temperature and thus be promoted to deteriorate. In addition, in the case where a heat dissipation layer or heat transmission layer is formed over the surface of the outer surface S2, the adhesion at the interface between the surface S2 and the heat dissipation layer or heat transmission layer tends to decrease to cause peeling-off readily, and thereby the device tends to be broken easily. On the other hand, if the arithmetic average of roughness profile Ra of the surface S2 is set to exceed the above upper limit, the surface S2 needs to be processed further in a special roughening step, and the productivity tends to decrease.

Incidentally, to measure the arithmetic average of roughness profile (the arithmetic average of roughness profile defined by JIS B 0601 (1994)), a contact-type step and surface roughness measuring device, for example, may be employed as a measuring device, and the measurement may be conducted.

Moreover, the ten point height of roughness profile Rz of JIS B 0601-1994 of the surface S1 of the sealing substrate 4 beside the sealing material layer 3 is preferably 0.4 to 4.0 µm, and more preferably 0.8 to 2.0 µm. When the ten point height of roughness profile Rz is less than the above lower limit, the adhesion to the sealing material layer 3 tends to decrease. On the other hand, when the ten point height of roughness profile Rz exceeds the above upper limit, the peaks of the asperities on the surface pierce through the sealing material layer when the organic EL device is being bent, with the results that the organic EL device is likely to cause a short circuit and the sealing substrate 4 and the second electrode 203 are likely to come into contact with each other to cause a short circuit.

In the present invention, the ten point height of roughness profile Rz of JIS B 0601-1994 of the surface (outer surface) S2 of the sealing substrate 4 is preferably 1.0 to 15 µm, and more preferably 2 to 10 µm. When the ten point height of roughness profile Rz is less than the above lower limit, the surface area of the surface S2 becomes smaller and heat generated in the light emitting element can be dissipated only in a smaller amount to the outside. As a result, the organic EL element tends to have a high temperature and thus be promoted to deteriorate. In addition, in the case where a heat dissipation layer or heat transmission layer is formed over the surface of the surface S2, the adhesion at the interface between the surface S and the heat dissipation layer or heat transmission layer tends to decrease to cause peeling-off readily, and thereby the device is more likely to be broken. On the other hand, if the ten point height of roughness profile Rz of the outer surface S2 is set to exceed the above upper limit, the surface S2 needs to be processed further in a special roughening step, and the productivity tends to decrease.

Incidentally, to measure the ten point height of roughness profile (the ten point height of roughness profile defined by JIS B 0601 (1994)), a contact-type step and surface roughness measuring device, for example, may be employed as a measuring device, and the measurement may be conducted.

A material for such a sealing substrate is not particularly limited, but is preferably any of metal materials including copper, copper alloys, aluminum, and aluminum alloys from the viewpoints of heat dissipation and ease of processing. Examples of the sealing substrates made of such metal materials include an aluminum foil, a copper foil, and the like.

Moreover, among such sealing substrates 4, a copper foil produced by an electrolytic process is more preferably, because the copper foil produced by the electrolytic process tends to have less pinholes and produce higher effects in prevention of permeation of water vapor, oxygen, and so on. In other words, use of such a copper foil produced by the electrolytic process as the sealing substrate 4 makes it possible to seal the organic EL more efficiently, so that a deterioration of the organic EL device due to permeation of moisture from the pinholes of the copper foil can be more satisfactorily inhibited. Note that such an electrolytic process is not particularly limited, but any publicly-known electrolytic process capable of producing a copper foil may be employed as needed.

In addition, the thickness of the sealing substrate 4 is not particularly limited, but is preferably 5 to 100 µm, and more preferably 8 to 50 µm. When the thickness of the sealing substrate 4 is less than the above lower limit, it is difficult to satisfactorily inhibit generation of pinholes in the sealing substrate 4 during production thereof, and a deterioration of the organic EL device due to permeation of moisture from the pinholes tends to be difficult to inhibit at a high level (the sealing performance tends to be decreased due to the pinholes). On the other hand, when the thickness of the sealing substrate 4 exceeds the above upper limit, the flexibility of the sealing substrate 4 is lowered with the result that the curvature radius of the bent organic EL device in which the sealing substrate 4 is bonded becomes large. Thus, the flexibility of the organic EL device tends to be lowered.

In addition, a method for disposing the sealing material layer 3 and the sealing substrate 4 on the transparent support substrate 1 is not particularly limited, and any publicly-known method may be employed as needed. For example, it is possible to employ a method for stacking (disposing) the sealing material layer 3 and the sealing substrate 4 on the transparent support substrate 1, in which a sealing material made of an adhesive material is applied to cover the light emitting element 2 on the transparent support substrate 1; the sealing substrate 4 is stacked thereon; and then the sealing material is cured and fixed. Instead, it is also possible to employ a method for stacking (disposing) the sealing material layer 3 and the sealing substrate 4 on the transparent support substrate 1, in which a layer made of a sealing material is formed on the sealing substrate 4 in advance, and then the sealing substrate 4 on which the layer made of the sealing material is formed is pressed against the light emitting element 2 such that the area around the light emitting element 2 can be covered with the layer made of the sealing material.

Then, the distance between the sealing substrate 4 and the light emitting element 2 in the thickness direction (the direction perpendicular to the sealing substrate 4) (the thickness of the sealing material layer 3 between the light emitting element 2 and the sealing substrate 4: the distance between the surface S1 of the sealing substrate 4 and the surface of the second electrode 203 in contact with the sealing agent layer 3) is preferably 5 to 120 µm, and more preferably 10 to 60 µm. If the distance between the sealing substrate 4 and the light emitting element 2 (the thickness of the sealing material layer 3 between the light emitting element 2 and the sealing substrate 4) is less than the above lower limit, the second electrode 203 and the sealing substrate 4 cannot be always satisfactorily inhibited from coming into contact with each other when being bent, so that it tends to be difficult to satisfactorily inhibit a short circuit and the light-emission performance tends to degrade easily. Also, when being bent, the second electrode 203 is pressed with the application of pressure by the asperities on the surface of the sealing substrate 4, and thereby tends to come into contact with the first electrode 201 and cause a short circuit. On the other hand, if the distance between the sealing substrate 4 and the light emitting element 2 exceeds the above upper limit, the surfaces of the sealing material layer in contact with the outside air increase so much that a larger amount of water vapor may permeate in the lateral directions of the sealing material layer (the directions perpendicular to the thickness direction: the directions parallel to the surface of the transparent support substrate 1). Accordingly, shortening of the storage life of the organic EL device tends to be difficult to inhibit at a higher level.

Heretofore, the preferred embodiment of the organic electroluminescent device of the present invention has been described with reference to FIGS. 1 and 2. However, the organic electroluminescent device of the present invention should not be limited to the above embodiment.

For example, the light emitting element 2 includes the pair of electrodes (the first electrode 201 and the second electrode 203), and the luminescent layer 202 disposed between the electrodes in the embodiment illustrated in FIG. 1. In the organic electroluminescent device in the present invention, however, the light emitting element 2 may include other layers as needed, as long as the object and the effects of the present invention are not impaired. Hereinafter, description will be provided for such other layers.

As such other layers which are usable in the organic EL device in addition to the pair of electrodes (the first electrode 201 and the second electrode 203) and the luminescent layer 202, it is possible to employ, as needed, any publicly-known layers used in the organic EL device, for example, a layer disposed between the cathode and the luminescent layer, and a layer disposed between the anode and the luminescent layer. As the layer disposed between the cathode and the luminescent layer, there are an electron injection layer, an electron transport layer, a hole blocking layer, and so on. Here, when only a single layer is provided between the cathode and the luminescent layer, the layer is an electron injection layer. Then, when two or more layers are provided between the cathode and the luminescent layer, the layer in contact with the cathode is called an electron injection layer and the other layer(s) is called an electron transport layer.

The electron injection layer is a layer having a function to improve the efficiency of electron injection from the cathode. The electron transport layer is a layer having a function to improve electron injection from the electron injection layer or from another electron transport layer closer to the cathode. Here, if the electron injection layer or the electron transport layer has a function to block the transport of holes, this layer is also called a hole blocking layer in some cases. Whether or not a layer has the function to block the transport of holes as described above can be checked by fabricating, for example, an element which allows only a hole current to flow, and by confirming the effect of blocking with a decrease in the current value.

As the layer provided between the anode and the luminescent layer, there are so-called a hole injection layer, a hole transport layer, an electron blocking layer, and so on. Here, when only a single layer is provided between the anode and the luminescent layer, the layer is a hole injection layer. Then, when two or more layers are provided between the anode and the luminescent layer, the layer in contact with the anode is called a hole injection layer and the other layer(s) is called a hole transport layer or the like. The hole injection layer is a layer having a function to improve the efficiency of hole injection from the cathode. The hole transport layer is a layer having a function to improve hole injection from the hole injection layer or from another hole transport layer closer to the anode. Note that if the hole injection layer or the hole transport layer has a function to block the transport of electrons, this layer is called an electron blocking layer in some cases. Whether or not a layer has the function to block the transport of electrons can be checked by fabricating, for example, an element which allows only an electron current to flow, and by confirming the effect of blocking with a decrease in the current value.

As a structure of the light emitting element including such other layers, there area structure in which an electron transport layer is provided between the cathode and the luminescent layer, a structure in which a hole transport layer is provided between the anode and the luminescent layer, a structure in which an electron transport layer is provided between the cathode and the luminescent layer and a hole transport layer is provided between the anode and the luminescent layer, and so on. As examples of the structures of the embodiment illustrated in FIG. 1 and other light emitting elements, the following structures a) to d) are presented:

a) anode/luminescent layer/cathode (the embodiment illustrated in FIG. 1);

b) anode/hole transport layer/luminescent layer/cathode;

c) anode/luminescent layer/electron transport layer/cathode; and d) anode/hole transport layer/luminescent layer/electron transport layer/cathode.

(Here, / indicates that layers on both sides are layered next to each other. The same applies below.)

Here, the hole transport layer is a layer having a function to transport holes, and the electron transport layer is a layer having a function to transport electrons. In the following description, the electron transport layer and the hole transport layer are referred to as a general name, that is, a charge transport layer. In addition, two or more layers may be provided as each of the luminescent layer, the hole transport layer, and the electron transport layer, independently. Moreover, among charge transport layers provided next to an electrode, a layer having a function to improve charge injection from the electrode and producing an effect of reducing a drive voltage of the device is generally called a charge injection layer (a hole injection layer or an electron injection layer) in particular.

Moreover, the aforementioned charge injection layer or an insulating layer having a film thickness of 2 nm or smaller may be provided next to an electrode in order to enhance the adhesion to the electrode or to improve charge injection from the electrode. In addition, a thin buffer layer may be inserted into the interface with any of the charge transport layer and the luminescent layer in order to enhance the adhesion at the interface, prevent mixing, and do the like. Thus, by taking account of the light emission efficiency and the device life, it is possible to design the number and the order of layers layered in the light emitting element and the thickness of each layer as needed and to use the layers.

As a light emitting element (organic EL element) provided with such a charge injection layer (electron injection layer and/or hole injection layer), there are one having a structure in which a charge injection layer is provided next to the cathode, one having a structure in which a charge injection layer is provided next to the anode, and so on.

As examples of the structures of such light emitting elements (organic EL elements), the following structures e) to p) are presented:

e) anode/charge injection layer/luminescent layer/cathode;

f) anode/luminescent layer/charge injection layer/cathode;

g) anode/charge injection layer/luminescent layer/charge injection layer/cathode;

h) anode/charge injection layer/hole transport layer/luminescent layer/cathode;

i) anode/hole transport layer/luminescent layer/charge injection layer/cathode;

j) anode/charge injection layer/hole transport layer/luminescent layer/charge injection layer/cathode;

k) anode/charge injection layer/luminescent layer/charge transport layer/cathode;
l) anode/luminescent layer/electron transport layer/charge injection layer/cathode;
m) anode/charge injection layer/luminescent layer/electron transport layer/charge injection layer/cathode;
n) anode/charge injection layer/hole transport layer/luminescent layer/charge transport layer/cathode;
o) anode/hole transport layer/luminescent layer/electron transport layer/charge injection layer/cathode; and
p) anode/charge injection layer/hole transport layer/luminescent layer/electron transport layer/charge injection layer/cathode.

Note that, in the case of forming a multilayer body including a luminescent layer and another layer (for example, a charge transport layer to be described later, or the like), it is desirable to form a hole transport layer on the anode before the luminescent layer is provided, or to form an electron transport layer after the luminescent layer is provided. Moreover, materials for these other layers are not particularly limited, and any publicly-known materials may be used as needed. A production method thereof is also not particularly limited, and any publicly-known method may be used as needed. For example, as a hole transporting material for forming a hole transport layer, which is a layer provided between the anode and the luminescent layer or the hole injection layer and the luminescent layer, there are: heterocyclic compounds typified by triphenyl amines, bis compounds, pyrazoline derivatives, and porphyrin derivatives; and polymer compounds such as polycarbonates having any of the above monomers at the side chains, styrene derivatives, polyvinyl carbazoles, and polysilanes. Then, the film thickness of the hole transport layer is preferably about 1 nm to 1 µm.

Moreover, as a material for forming a hole injection layer (a layer that can be provided between the anode and the hole transport layer or between the anode and the luminescent layer) among the aforementioned charge injection layers, there are phenylamine-based compounds, starburst amine-based compounds, phthalocyanine-based compounds, oxides such as vanadium oxide, molybdenum oxide, ruthenium oxide, and aluminum oxide, amorphous carbons, polyanilines, polythiophene derivatives, and so on.

In addition, as a material for forming the electron transport layer, which is a layer that can be provided between the luminescent layer and the cathode or between the luminescent layer and the electron injection layer, there are, for example, substances, such as oxadiazoles and aluminum quinolinol complexes, which generally form stable radical anions and have high ionization potential. Specifically, there are 1,3,4-oxadiazole derivatives, 1,2,4-triazole derivatives, imidazole derivatives, and so on. The film thickness of the electron transport layer is preferably about 1 nm to 1 µm.

Further, as the electron injection layer (a layer that can be provided between the electron transport layer and the cathode or between the luminescent layer and the cathode) among the charge injection layers, it is possible to provide, depending on a kind of the luminescent layer, for example, an electron injection layer having a monolayer structure of a Ca layer, or an electron injection layer having a multilayer structure including a Ca layer and a layer made of any one or two of metals included in Groups IA and IIA of the periodic table excluding Ca and each having a work function of 1.5 to 3.0 eV, and oxides, halides, and carbonates of these metals. Examples of the metals included in Group IA of the periodic table and each having a work function of 1.5 to 3.0 eV, and their oxides, halides, and carbonates are lithium, lithium fluoride, sodium oxide, lithium oxide, lithium carbonate, and so on. Meanwhile, examples of the metals included in Group IIA of the periodic table excluding Ca and each having a work function of 1.5 to 3.0 eV, and their oxides, halides, and carbonates are strontium, magnesium oxide, magnesium fluoride, strontium fluoride, barium fluoride, strontium oxide, magnesium carbonate, and so on. The electron injection layer is formed by a vapor deposition method, a sputtering method, a printing method, or the like. The film thickness of the electron injection layer is preferably about 1 nm to 1 µm.

In the foregoing preferred embodiment of the organic electroluminescent device of the present invention, the gas-barrier multilayer film is described with reference to FIG. 2 as a preferred example of the transparent support substrate 1 used in the device. However, the structure of the gas-barrier multilayer film is also not limited to that in the embodiment illustrated in FIG. 2, and may further include a thin film layer or have another multilayer structure. Here, as an example of a gas-barrier multilayer film further including a thin film layer, there is a gas-barrier multilayer film having a structure in which "first thin film layer/first base material layer/adhesive layer/second thin film layer/second base material layer/third thin film layer" are layered in this order (here, "/" indicates that these layers are layered next to each other) or the like. Such a gas-barrier multilayer film having the structure in which the "first thin film layer/first base material layer/adhesive layer/second thin film layer/second base material layer/third thin film layer" are layered in this order may be produced as needed, for example, by employing the same method as the foregoing method including steps (A) and (B), except that a film member in which thin film layers are formed on both surfaces of a base material is prepared as a second film member in the aforementioned step (A) and is used.

EXAMPLES

Hereinafter, the present invention will be described in more details based on Examples and Comparative Examples, but the present invention should not be limited to the following Examples.

Preparation Example 1

<Preparation of Film Member (A)>
Using the same method as the method described in Example 1 of JP 2011-73430 A except that the degree of vacuum in the vacuum chamber was changed to 1 Pa, thin film deposition by the plasma CVD method was carried out on a base material made of a biaxially oriented polyethylene naphthalate film (PEN film, thickness: 100 µm, width: 350 mm, trade name "Teonex Q65FA" manufactured by Teijin DuPont Films Japan Limited) to obtain a multilayer film including the base material on which a thin film layer having a thickness of 1.2 µm was formed (a multilayer body in which the thin film layer/base material layer are layered in this order: hereinafter referred to as "film member (A)").

<Preparation of Film Member (B)>
After the film member (A) was obtained as described above, the film member (A) was used in place of the base material, and a new thin film was formed on the surface of the film member (A), on which the thin film layer was not formed, under the same conditions as the deposition conditions employed in the preparation of the film member (A) to obtain a multilayer film including the base material on both surfaces of which the thin film layers having a thickness of 1.2 µm were formed (a multilayer body in which the thin film layer/base material layer/thin film layer are layered in this order: hereinafter referred to as "film member (B)").

Here, the thin film layers formed in the film members (A) and (B) were subjected to XPS depth profile measurement under the following conditions to obtain silicon distribution curves, oxygen distribution curves, carbon distribution curves and oxygen carbon distribution curves. Then, the carbon distribution curve of each thin film layer was confirmed to have at least one distinct extremum, and have an absolute value of the difference between the maximum value and the minimum value of the atomic ratio of carbon being 5 at % or greater, and the atomic ratio of silicon, the atomic ratio of oxygen, and the atomic ratio of carbon were configured to satisfy a requirement represented by the following formula (1):

(atomic ratio of oxygen)>(atomic ratio of silicon)> (atomic ratio of carbon)   (1).

<XPS Depth Profile Measurement Conditions>
Etching ion species: Argon (Ar+);
Etching rate (a value in terms of $SiO_2$ thermal oxide film): 0.05 nm/sec;
Etching interval (a value in terms of $SiO_2$): 10 nm;
X-ray Photoelectron Spectroscope: manufactured by Thermo Fisher Scientific K.K., model name "VG Theta Probe";
X-ray for irradiation: single crystal spectral AlKα; and
X-ray spot and its size: an oval shape of 800×400 µm.

Further, a gas barrier property of the film member (A) was measured by a method in accordance with a calcium corrosion method (a method described in JP 2005-283561 A). Specifically, metal calcium was deposited on the film member after a drying treatment, and then was sealed with metal aluminum from above. After that, the resultant film member was fixed to a glass plate, and then was sealed with resin to obtain a sample. Under the conditions of a temperature of 40° C. and a humidity of 90% RH, the water vapor permeability of the sample was calculated by image analysis examining an increase of corrosion points over time. Here, in calculating the water vapor permeability as mentioned above, images of the corrosion points were captured with a microscope, and then was taken into a personal computer. Then, each of the images of the corrosion points was binarized and the water vapor permeability was calculated by calculating and obtaining the corrosion area. As a result, the water vapor permeability of the film member (the base material on the surface of which the thin film layer was formed) was $1 \times 10^{-5}$ $g/m^2/day$. Note that, using a sample made only of the base material (PEN film), the gas barrier property was also measured in the same way using the above method in accordance with the calcium corrosion method (the method described in JP 2005-283561 A), and the gas barrier property of the base material was found to be 1.3 $g/m^2/day$. Based on these result, it was confirmed that the "water vapor permeability of base material with thin film layer formed" takes a value smaller by two or more digits than a value of the "water vapor permeability of base material". These results revealed that the thin film layers in the film members (A) and (B) each have gas barrier properties.

<Preparation of Gas-Barrier Multilayer Film>
The film member (A) and the film member (B) obtained as described above were both dried in a vacuum oven at a temperature condition of 100° C. for 360 minutes. Thereafter, the two film members were taken out from the vacuum oven to the atmospheric air (temperature: 25° C., relative humidity: 50%, humidity ratio: 10 g/kg (dry air)). Then, by a bonding apparatus with a silicone rubber roll having a rubber hardness of 60, the film member (A) and the film member (B) were bonded together with an adhesive such that the surface of the film member (A) on the base material side faces the thin film layer of the film member (B) to obtain a gas-barrier multilayer film. The adhesive used herein is a two-part epoxy adhesive which is cured at room temperature (25° C.) when a base resin composed of a base resin composed of a bisphenol A epoxy resin and a curing agent composed of a modified polyamide are mixed. Here, a time required to start the step of bonding the two film members after taking out the two film members from the vacuum oven was 10 minutes and a time required for the bonding was 15 minutes. Thus, it took 25 minutes in total to form the gas-barrier multilayer film after the two film members after the drying step were taken out from the vacuum oven. The multilayer structure of the gas-barrier multilayer film thus obtained is a structure in which the "first thin film layer/first base material layer/adhesive layer/second thin film layer/second base material layer/third thin film layer" are layered in this order. Note that, in the gas-barrier multilayer film, a multilayer structure portion of the "first thin film layer/first base material layer" is a structure derived from the film member (A), and a multilayer structure portion of the "second thin film layer/second base material layer/third thin film layer" is a structure derived from the film member (B). In addition, the hygroscopicity (the aforementioned ratio of moisture absorption Bn) of the gas-barrier multilayer film thus obtained was measured as described above, and the gas-barrier multilayer film was found to be capable of absorbing and retaining water in a weight of 0.29% by mass of its own weight.

Example 1

On the first thin film layer (the thin film layer derived from the film member (A)) in the gas-barrier multilayer film obtained in Preparation Example 1, an ITO film with a film thickness of 150 nm was deposited in patterns by a sputtering method using a metal shadow mask. By this pattern deposition, the ITO film was deposited in such patterns as to form two regions on the surface of the gas-barrier multilayer film, and one of the regions was used as a lead electrode for the cathode, whereas the other region was used as the anode (ITO electrode).

Next, the surface of the gas-barrier multilayer film on which the ITO film (ITO electrode) was formed was subjected to a UV-$O_3$ treatment for 15 minutes using a UV-$O_3$ apparatus (manufactured by TECHNOVISION, INC.), so that the surface on which the ITO film was formed was cleaned and modified.

Subsequently, a filtrate obtained by filtering a suspension of poly(3,4)ethylenedioxythiophene/polystyrenesulfonic acid (trade name "AI4083" produced by Heraeus K. K.) through a 0.2 micron filter was spin-coated to form a film on the surface of the gas-barrier multilayer film on which the ITO film was formed, followed by drying on a hot plate at a temperature condition of 130° C. for 30 minutes in the atmospheric air. Thus, a hole injection layer with a thickness of 65 nm was formed on the ITO film.

Next, a xylene solution in which a luminescent material (polymer compound 1) was dissolved in xylene as an organic solvent was prepared. Note that such a luminescent material (polymer compound 1) was prepared in the same method as the method for preparing the composition described in Example 1 of JP 2012-144722 A. The concentration of the polymer compound 1 in the xylene solution was set to 1.2% by mass.

Next, the xylene solution was applied by spin-coating in the atmospheric air onto the surface, on which the hole injection layer was formed, of the gas-barrier multilayer film on which the ITO film and the hole injection layer were formed, and thereby a coating film having a thickness of 80 nm for a luminescent layer was formed. Thereafter, the resultant gas-barrier multilayer film was allowed to stand and was dried under a temperature condition of 130° C. for 10 minutes in a nitrogen gas atmosphere in which the oxygen concentration and the moisture concentration were each controlled at a volume ratio of 10 ppm or less, and thereby the luminescent layer was stacked on the hole injecting layer. Subsequently, the hole injection layer and the luminescent layer formed on contact parts to be in contact with external electrodes (the parts of the lead electrodes for the anode and the cathode) were removed, and thereby these parts were exposed to become capable of coming into contact with the external electrodes. After that, the gas-barrier multilayer film on which the ITO film, the hole injection layer, and the luminescent layer were formed was transferred to a vapor deposition chamber, and was aligned in position with a cathode mask. Then, vapor deposition of a cathode was carried out by rotating the mask and a base board to deposit the cathode such that the cathode was stacked on the surface of the luminescent layer and was electrically connected to the part constituting the lead electrode for the cathode. The cathode thus formed has a multilayer structure in which sodium fluoride (NaF) was firstly heated and vapor-deposited in a thickness of 4 nm at a vapor deposition rate of about 0.5 Å/sec, and then aluminum (Al) was vapor-deposited in a thickness of 100 nm at a vapor deposition rate of about 4 Å/sec.

Figure 3:
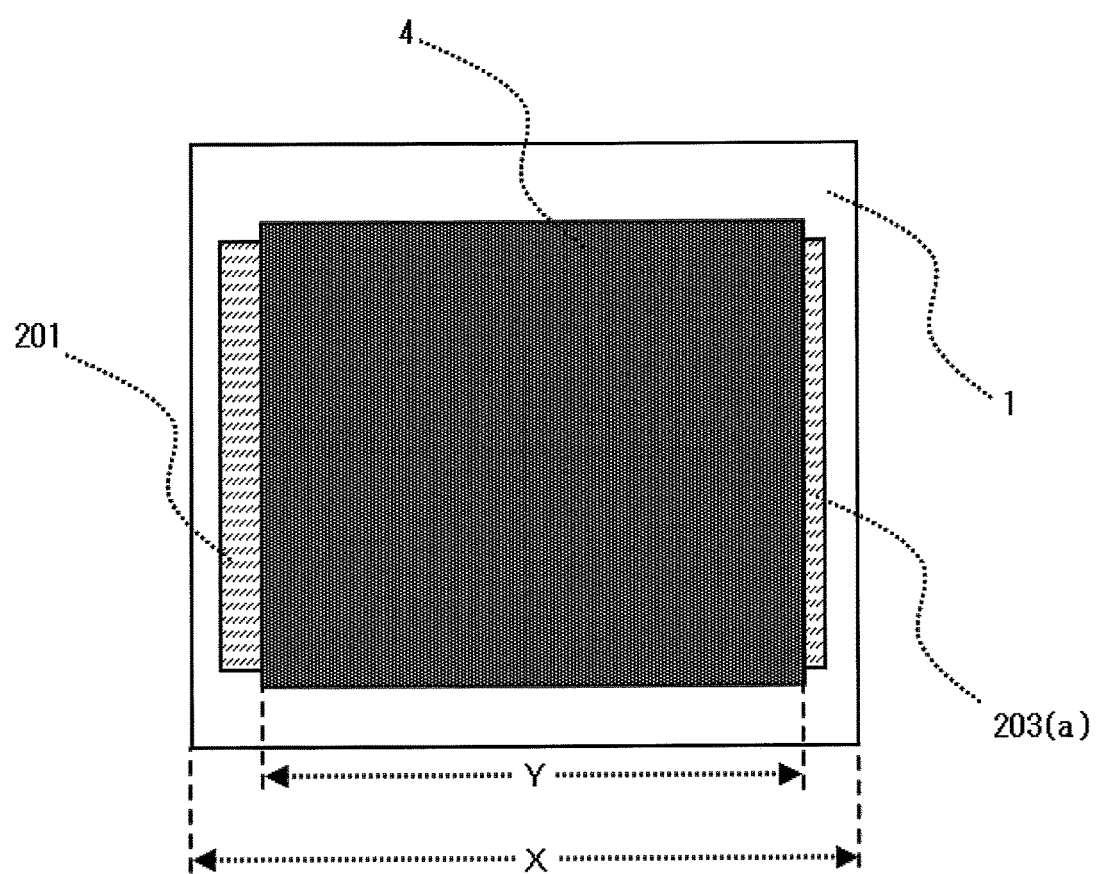
FIG. 3 is a schematic upper side view schematically illustrating a structure of an organic electroluminescent device obtained in Example 1 when viewed from a sealing substrate side.

Next, a copper foil with a thickness of 35 μm was cut by a roller cutter to prepare a sealing substrate. Specifically, the copper foil used herein had surface roughness with an arithmetic average of roughness profile Ra of 0.25 μm and a ten point height of roughness profile Rz of 1 μm on one surface (simply referred to as the "first surface" for convenience in some cases below), and had surface roughness with an arithmetic average of roughness profile Ra of 2.4 μm and a ten point height of roughness profile Rz of 9.5 μm on the other surface (simply referred to as the "second surface" for convenience in some cases below). The copper foil was cut herein into a shape in such a size that a cut piece of the copper foil, when viewed from the cathode side after being stacked on the cathode side, can entirely hide the cathode and the luminescent layer while party exposing the contact parts (the parts constituting the lead electrodes for the anode and the cathode) with the external electrodes to the outside (as illustrated in FIG. 3, a shape in such a size that, when viewed from above, an electrolytic copper foil (sealing substrate 4) has an area larger than the cathode so that the cathode cannot be viewed, and the contact parts on the gas-barrier multilayer film formed for contact with the outside (the parts constituting the lead electrodes for the anode and the cathode) partly stick out of the foil and thus can be viewed). Here, the copper foil thus prepared had a length of 40 mm, a width of 40 mm, and a thickness of 35 μm. Moreover, an electrolytic copper foil produced by an electrolytic process was used as the copper foil.

In addition, a two-part epoxy adhesive which is cured at room temperature (25° C.) when a base resin composed of a bisphenol A epoxy resin and a curing agent composed of a modified polyamide are mixed was prepared as a sealing material. Then, the sealing substrate (the foregoing copper foil) was heated at a temperature condition of 130° C. for 15 minutes in a nitrogen atmosphere to remove water adsorbed on the surfaces of the sealing substrate (subjected to a drying treatment).

Next, sealing was carried out in such a way that the sealing material was applied to cover the light emitting unit constituted by a multilayer structure portion including the ITO film/hole injection layer/luminescent layer/cathode, and then the sealing substrate was bonded to a layer of the sealing material such that the sealing substrate faces the luminescent layer. Specifically, the sealing material (adhesive) was applied to cover the multilayer structure portion including the ITO film/hole injection layer/luminescent layer/cathode (but excluding portions of the connecting parts (the parts constituting the lead electrodes) for allowing the electrodes to be electrically connected to the outside). Then, in the nitrogen, the sealing substrate was bonded with the first surface (the surface with a Ra of 0.25 μm) being in contact, with no air bubbles allowed to enter, with the sealing material (adhesive) layer on the surface of the gas-barrier multilayer film after the cathode was formed. In this way, the light emitting element (the multilayer structure portion including the ITO film/hole injection layer/luminescent layer/cathode: excluding portions of the lead electrodes) was sealed to fabricate the organic EL device. The organic EL device thus fabricated is flexible, and has a structure in which the hole injection layer is further stacked in the light emitting element 2 of the organic EL device in the embodiment illustrated in FIG. 1 (the structure of the organic EL device is basically the same as that of the light emitting element 2 illustrated in FIG. 1, but is different in that the light emitting element further includes the hole injection layer). Here, as the transparent support substrate 1, the gas-barrier multilayer film having a structure where the "first thin film layer/first base material layer/adhesive layer/second thin film layer/second base material layer/third thin film layer" were layered in this order was used. In addition, the thickness of the sealing material layer (the height from the transparent support substrate) was 10 μm, and the distance between the sealing substrate (copper foil) and the cathode was 10 μm. FIG. 3 illustrates a schematic view of such an organic EL device when viewed from the sealing substrate side. As illustrated in FIG. 3, when the organic EL device obtained in Example 1 is viewed from the sealing substrate 4 side, it is possible to see the transparent support substrate 1, the part of the anode 201 sticking out (the connecting part with the outside: the part constituting the lead electrode), the connecting part (lead electrode) 203(a) where the cathode is to be connected to the outside, and the sealing substrate 4. In this way, in this Example, the sealing with the sealing material and the sealing substrate was provided so as to seal and cover the area around the light emitting element (the multilayer structure portion including the ITO film/hole injection layer/luminescent layer/cathode) while leaving the parts of the lead electrodes for the anode and the cathodes connectable to the outside (see FIGS. 1 and 3). Note that, in this organic EL device, the arithmetic average of roughness profile of the surface of the sealing substrate in contact with the sealing material layer had a smaller value than the arithmetic average of roughness profile of the surface of the sealing substrate out of contact with the sealing material layer, and the ratio (Ra/t) of the arithmetic average of roughness profile Ra of the surface of the sealing substrate in contact with the sealing material layer to the thickness t of the sealing material layer was 0.025. In addition, the gas-barrier multilayer film (transparent support substrate 1) illustrated in FIG. 3 had a lateral length X of 50 mm, and the sealing substrate 4 had a lateral length Y of 40 mm. Moreover, in this Example, a light emission area (the area of a portion from which light is emitted) in the light emitting element was a length of 10 mm and a width of 10 mm.

Comparative Example 1

An organic EL device was fabricated in the same way as in Example 1 except that, in the fabrication of the multilayer body for sealing, the sealing substrate was bonded onto the sealing material layer such that the surface (second surface) with the arithmetic average of roughness profile Ra of 2.4 µm was in contact with the sealing material layer, instead of bonding the sealing substrate onto the sealing material layer such that the surface (first surface) with the arithmetic average of roughness profile Ra of 0.25 µm was in contact with the sealing material layer. In this organic EL device, the arithmetic average of roughness profile of the surface of the sealing substrate in contact with the sealing material layer had a larger value than the arithmetic average of roughness profile of the surface of the sealing substrate out of contact with the sealing material layer, and the ratio (Ra/t) of the arithmetic average of roughness profile Ra of the surface of the sealing substrate in contact with the sealing material layer to the thickness t of the sealing material layer was 0.24.
[Characteristic Evaluation of Organic EL Devices Obtained in Example 1 and Comparative Example 1]

After application of a reverse bias voltage, the organic EL elements obtained in Example 1 and Comparative Example 1 were each caused to emit light by application of a forward bias voltage. Then, the current densities of the organic EL elements obtained in Example 1 and Comparative Example 1 in an initial state (in a state before a bending test described below) were measured at a reverse bias voltage of −5 V and determined to be −0.29 mA/cm$^2$ (Example 1) and −0.29 mA/cm$^2$ (Comparative Example 1). These current densities were each determined by measuring a current and a voltage using a DC power device and a multimeter as a measuring device.

Next, a step of bending each of the organic EL elements in such a way as to curve the sides of the organic EL element having the length X illustrated in FIG. 3 and then restoring the organic EL element to the original state was repeated 100 times (bending test). Here, the organic EL elements were each bent to have a curvature radius of 25 mm when bent at maximum.

Subsequently, after application of a reverse bias voltage, the organic EL elements after the bending test were each caused to emit light by application of a forward bias voltage. After that, the current densities at the reverse bias voltage of −5 V were measured. As a result, the current densities of the organic EL elements obtained in Example 1 and Comparative Example 1 after the bending test were −0.29 mA/cm$^2$ (Example 1) and −0.4 mA/cm$^2$ or more (Comparative Example 1).

Thus, the organic EL device obtained in Example 1 was found having no failure due to a short circuit (short-circuit failure) in particular, because the current density was −0.29 mA/cm$^2$ in the initial state and was −0.29 mA/cm$^2$ after the bending test and there was no difference between the current density values (equal values) before and after the bending test. On the other hand, the organic EL device obtained in Comparative Example 1 was found having a failure due to a short circuit (short-circuit failure) after the bending test, because the current density was −0.29 mA/cm$^2$ in the initial state and was −0.4 mA/cm$^2$ or more after the bending test and it was confirmed that the bending test caused the current density to increase by an amount greatly exceeding a measurement error. In addition, the light emitting states were examined. As a result, it was found that the organic EL element obtained in Example 1 had almost the same light emitting state before and after the bending test, and maintained the light-emission performance satisfactorily, whereas the organic EL element obtained in Comparative Example 1 had problems such as reduction in the emission luminance and generation of dark spots, and failed to maintain the light-emission performance satisfactorily due to the bending test.

From these results, it was confirmed that the organic electroluminescent device (Example 1) of the present invention is capable of satisfactorily inhibiting the occurrence of a short circuit after being bent, and is satisfactorily usable in a use environment in which the device is to be bent repeatedly.

INDUSTRIAL APPLICABILITY

As described above, according to the present invention, it is possible to provide an organic electroluminescent device capable of satisfactorily inhibiting the occurrence of a short circuit after being bent.

Therefore, the organic electroluminescent device of the present invention is a device that is capable of satisfactorily inhibiting a failure due to bending and thus is highly reliable in bending, and therefore is suitably usable in, for example, a flexible illumination apparatus, a flexible planar light source, a flexible display, and the like.

REFERENCE SIGNS LIST

1: transparent support substrate
2: light emitting element
3: sealing material layer
4: sealing substrate
100(a): first base material layer
100(b): second base material layer
101(a): first thin film layer having gas barrier properties
101(b): second thin film layer having gas barrier properties
102: adhesive layer
201: first electrode
202: luminescent layer
203: second electrode
203(a): lead electrode of second electrode
X: lateral length of transparent support substrate
Y: lateral length of sealing substrate
S1 and S2: surfaces of sealing substrate

The invention claimed is:
1. An organic electroluminescent device comprising:
a transparent support substrate having flexibility;
a light emitting element disposed on the transparent support substrate and including a pair of electrodes and a luminescent layer disposed between the pair of electrodes;
a sealing material layer disposed on the transparent support substrate so as to cover and seal the light emitting element; and
a sealing substrate disposed on the sealing material layer, wherein
based on an arithmetic average of roughness profile defined in JIS B 0601-1994, the surface roughness of a surface of the sealing substrate beside the sealing material layer has a smaller value than the surface roughness of an opposite surface of the sealing substrate, and the arithmetic average of roughness profile of the surface of the sealing substrate beside the sealing material layer and a thickness of the sealing material layer satisfy a requirement represented by the following formula (I):

$$0.002 < (Ra/t) \leq 0.03 \tag{I}$$

[in the formula (I), Ra denotes the arithmetic average of roughness profile of JIS B 0601-1994 of the surface of the sealing substrate beside the sealing material layer, and t denotes the thickness of the sealing material layer].

2. The organic electroluminescent device according to claim 1, wherein the arithmetic average of roughness profile of the surface of the sealing substrate beside the sealing material layer is 0.1 to 1.0 μm.

3. The organic electroluminescent device according to claim 1, wherein the thickness of the sealing material layer is 5 to 120 μm.

4. The organic electroluminescent device according to claim 1, wherein the sealing substrate is made of any of metal materials of copper, copper alloys, aluminum, and aluminum alloys.

5. The organic electroluminescent device according to claim 1, wherein the sealing substrate is made of an electrolytic copper foil.

6. The organic electroluminescent device according to claim 1, wherein the arithmetic average of roughness profile Ra of the opposite surface, of the sealing substrate is 0.25 to 3.8 μm.

7. The organic electroluminescent device according to claim 1, wherein $(Ra/t) \leq 0.01$.

* * * * *